US012607889B2

(12) United States Patent
Dunn et al.

(10) Patent No.: US 12,607,889 B2
(45) Date of Patent: Apr. 21, 2026

(54) SELF-CONTAINED ELECTRONIC DISPLAY ASSEMBLY, MOUNTING STRUCTURE AND METHODS FOR THE SAME

(71) Applicant: Manufacturing Resources International, Inc., Alpharetta, GA (US)

(72) Inventors: William Dunn, Alpharetta, GA (US); Marcos Diaz, Alpharetta, GA (US); Andrew Lincoln, Atlanta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 19/275,359

(22) Filed: Jul. 21, 2025

(65) Prior Publication Data

US 2025/0347946 A1 Nov. 13, 2025

Related U.S. Application Data

(60) Continuation of application No. 18/962,069, filed on Nov. 27, 2024, now Pat. No. 12,393,069, which is a continuation of application No. 18/750,389, filed on Jun. 21, 2024, now Pat. No. 12,197,058, which is a division of application No. 18/233,525, filed on Aug. 14, 2023, now Pat. No. 12,072,561, which is a continuation-in-part of application No. 17/870,913, filed on Jul. 22, 2022, now Pat. No. 12,010,813.

(51) Int. Cl.
G02F 1/1333 (2006.01)
G02F 1/13357 (2006.01)
H05K 7/20 (2006.01)

(52) U.S. Cl.
CPC .. *G02F 1/133308* (2013.01); *G02F 1/133342* (2021.01); *G02F 1/133385* (2013.01); *H05K 7/20972* (2013.01); *G02F 1/133602* (2013.01)

(58) Field of Classification Search
None
See application file for complete search history.

(56) References Cited

U.S. PATENT DOCUMENTS

2019/0377390 A1* 12/2019 Wang ..................... G06F 1/181

* cited by examiner

*Primary Examiner* — Richard H Kim
(74) *Attorney, Agent, or Firm* — Standley Law Group LLP; Jeffrey S. Standley; Adam J. Smith

(57) ABSTRACT

Display assemblies and related systems and methods for mounting are provided. A first mounting device includes a first complementary portion extending, at least primary, in a first direction. A side assembly includes a display layer and a backlight, and a second mounting device located, at least in part, rearward of at least a viewing surface of the display layer. The second mounting device includes a second complementary portion extending, at least primarily, in a second direction. The first mounting device receives the side assembly by complementary engagement of the first complementary portion and the second complementary portion, engagement of which secures the side assembly to the first mounting device in a removable fashion.

20 Claims, 22 Drawing Sheets

100

116

114

115

112

108D

108C

Detail A

Detail B

100

100

121B

114

112

108D

121A

105

108C

202

203

204

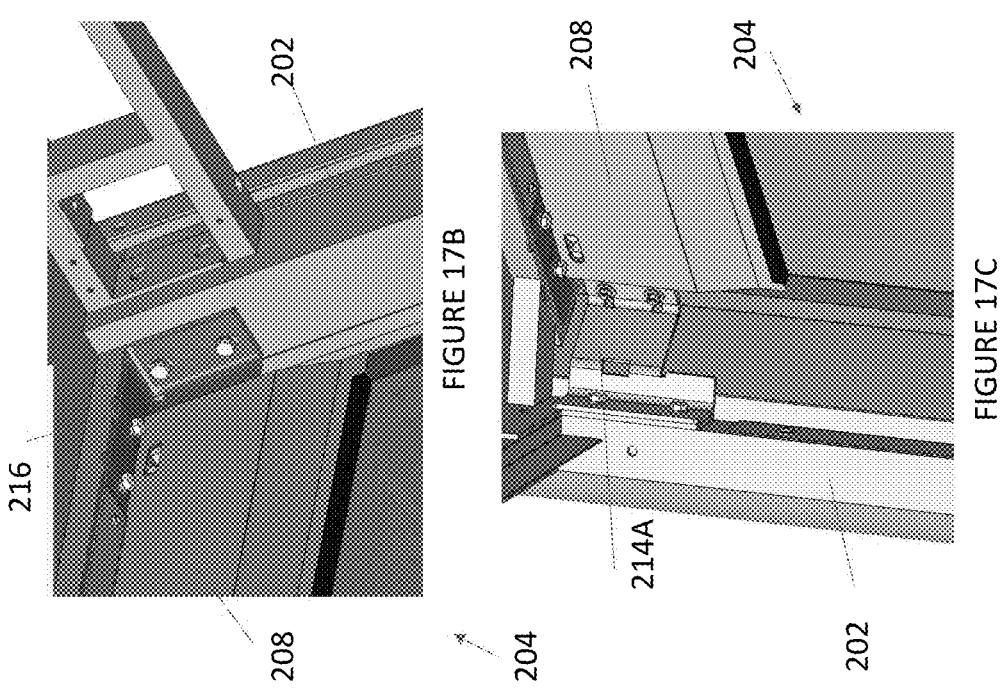
FIGURE 17B
FIGURE 17C
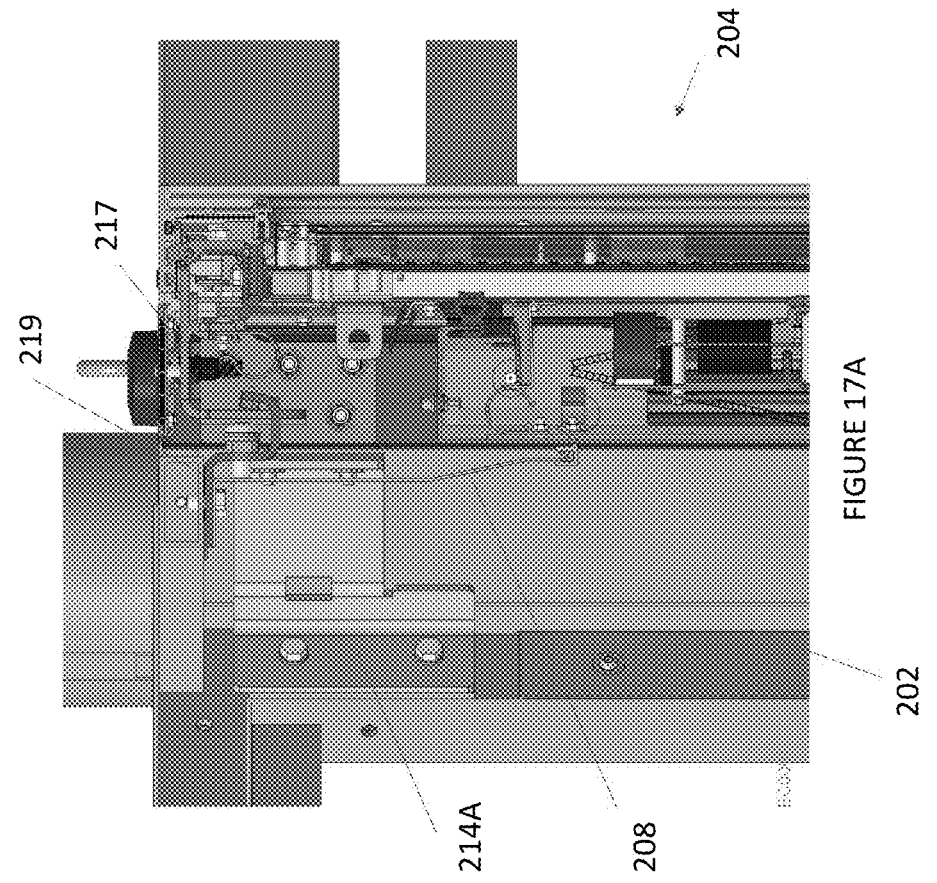
FIGURE 17A

SELF-CONTAINED ELECTRONIC DISPLAY ASSEMBLY, MOUNTING STRUCTURE AND METHODS FOR THE SAME

CROSS-REFERENCE TO RELATED APPLICATIONS

This application is a continuation of U.S. application Ser. No. 18/962,069 filed Nov. 27, 2024, which is a continuation of U.S. application Ser. No. 18/750,389 filed Jun. 21, 2024, now U.S. Pat. No. 12,197,058 issued Jan. 14, 2025, which is a divisional of U.S. application Ser. No. 18/233,525 filed Aug. 14, 2023, now U.S. Pat. No. 12,072,561 issued Aug. 27, 2024, which is a continuation-in-part of U.S. application Ser. No. 17/870,913 filed Jul. 22, 2022, now U.S. Pat. No. 12,010,813 issued Jun. 11, 2024, the disclosures of which are hereby incorporated by reference as if fully restated herein.

TECHNICAL FIELD

Exemplary embodiments relate generally to self-contained electronic display assemblies as well as mounting structures and methods related to the same.

BACKGROUND AND SUMMARY OF THE INVENTION

The demand for digital out of home ("DOOH") advertising units has grown significantly in recent years. However, public and private real-estate space remains highly sought after and expensive. Advertisers are increasingly looking for new areas and mediums to provide advertising and other public announcement opportunities. What is needed is a display assembly that is adapted for installation at a variety of environments.

A self-contained electronic display assembly, as well as a mounting structure and methods for the same are provided. The disclosed self-contained electronic display assembly is adapted for installation at a variety of environments, such as by virtue of its largely, or entirely, self-contained nature. The mounting structure is highly adaptable for relatively simple installation in a number of different environments. Each of the electronic display assemblies may comprise a dedicated open loop airflow pathway and/or a dedicated closed loop airflow pathway. The closed loop airflow pathway may encircle an electronic display. The open loop airflow pathway may extend along a backlight for the electronic display. Other airflow configurations may be utilized.

The mounting structure may be configured to flexibly accommodate a variety of electronic equipment. Some or all of the electronic equipment may not necessarily be required for operation of the electronic display assemblies. For example, without limitation, the mounting structure may be configured to accommodate and/or provide electrical power and/or network connectivity to, electric vehicle ("EV") charging equipment, power transformers, traffic control devices, parking meters, street lighting equipment, and/or other civil or government and/or privately owned equipment. This may permit increased opportunity to place units within existing street or other public spaces.

The mounting structure may be configured to removably accept one or more of the electronic display assemblies. In exemplary embodiments, without limitation, the mounting structure is configured to accept two of the electronic display assemblies on opposing sides thereof.

In exemplary embodiments, without limitation, the mounting structure may comprise one or more hooks. For example, a set of one or more hooks may be installed to, provided at, and/or form part of a framework for connection to a ground surface, wall, or the like, and/or directly to a wall or other structure without the need for a separate framework. A complementary set of one or more hooks may be installed to, provided at, and/or form part of the electronic display assemblies. The hooks may be configured to mate with one another, preferably in a selectively removable fashion such that the electronic display assemblies may be removably installed. The complementary hooks may be configured to permit rotational movement of the electronic display assemblies when mounted. This arrangement may be used for newly constructed and/or installed units and/or to retrofit existing street furniture and other structures, such as but not limited to bus shelters.

The mounting structure may comprise a dedicated, open loop airflow pathway between the electronic display assemblies to thermally manage some or all of the electronic equipment. The open loop airflow pathway of the mounting structure may be wholly or partially separate from the open and/or closed loop airflow pathways of the electronic display assemblies, such as in accordance with various ingress protection ("IP") standards.

The mounting structure may be relatively compact for transportation. The mounting structure may permit removable attachments of the electronic display assemblies such that they may be removed for proper orientation during transport.

Alternative to a dedicated mounting structure, the electronic display assemblies may be configured for mounting to existing building walls, EV charging equipment, power transformers, traffic control devices, parking meters, street lighting equipment, and/or other civil or government and/or privately owned equipment or other buildings, structures, and/or surfaces.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 17A is a detailed side sectional view of the mounted display of FIGS. 16A and 16F;

FIG. 17B is a detailed perspective view of the mounted display of FIGS. 16A and 16F;

FIG. 17C is another detailed perspective view of the mounted display of FIGS. 16A and 16F;

DETAILED DESCRIPTION OF EXEMPLARY EMBODIMENT(S)

Figure 2:
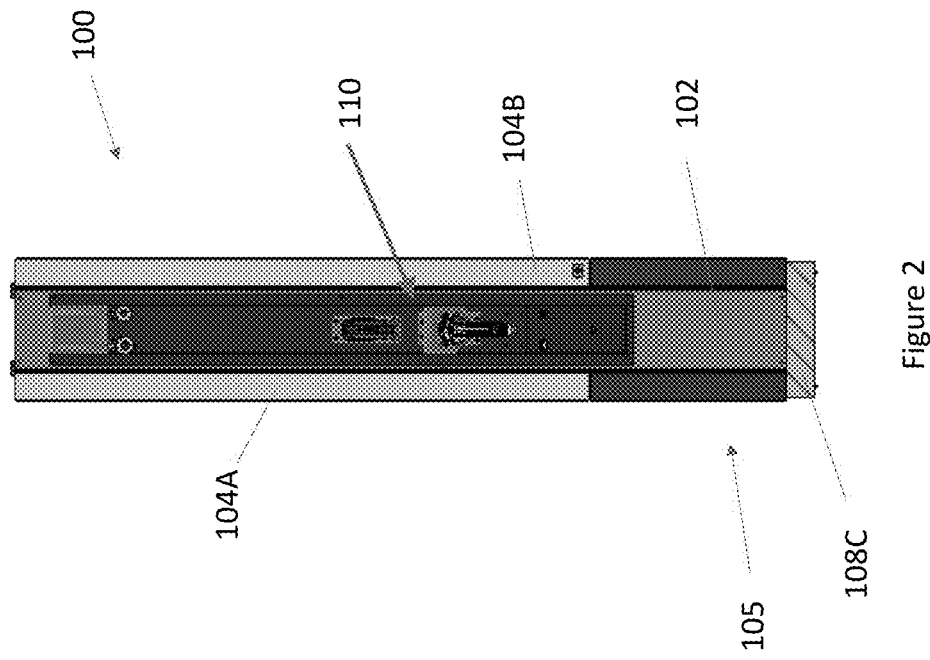
FIG. 2 is a side view of the display assembly of FIG. 1.
Figure 1:
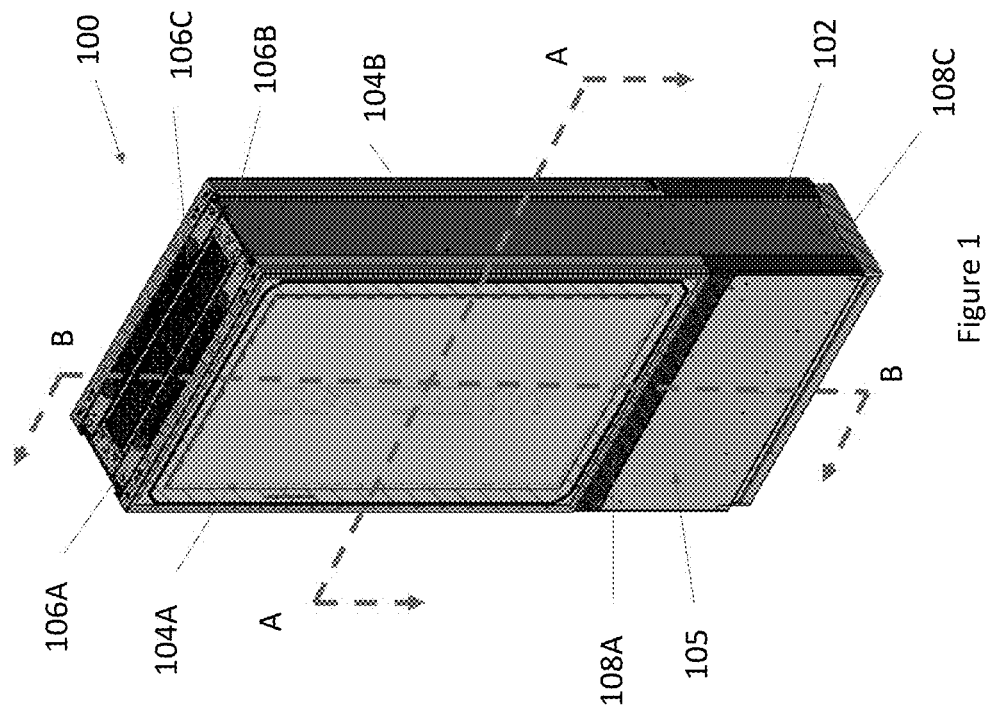
FIG. 1 is a perspective view of an exemplary display assembly also illustrating section lines A-A and B-B.
Figure 4:
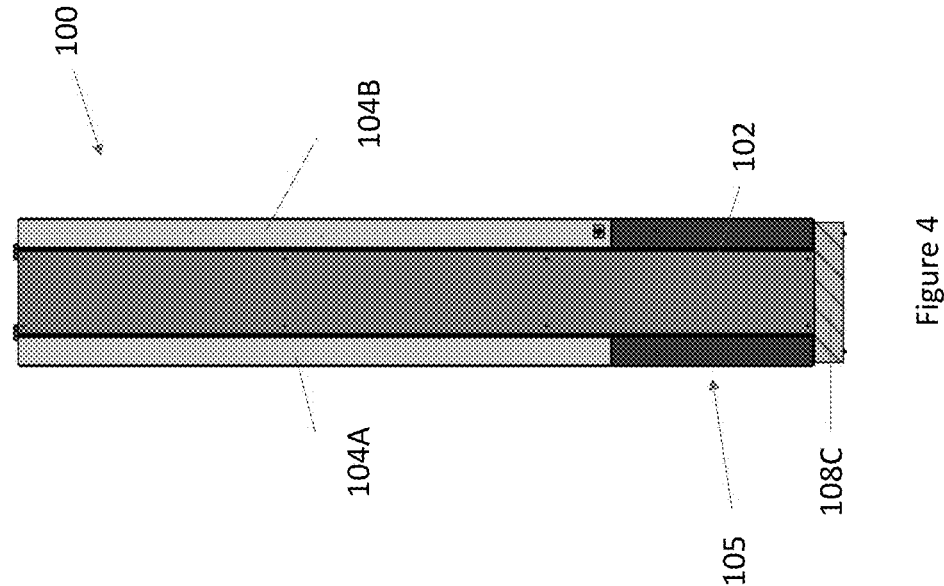
FIG. 4 is a side view of the display assembly of FIG. 1.
Figure 3:
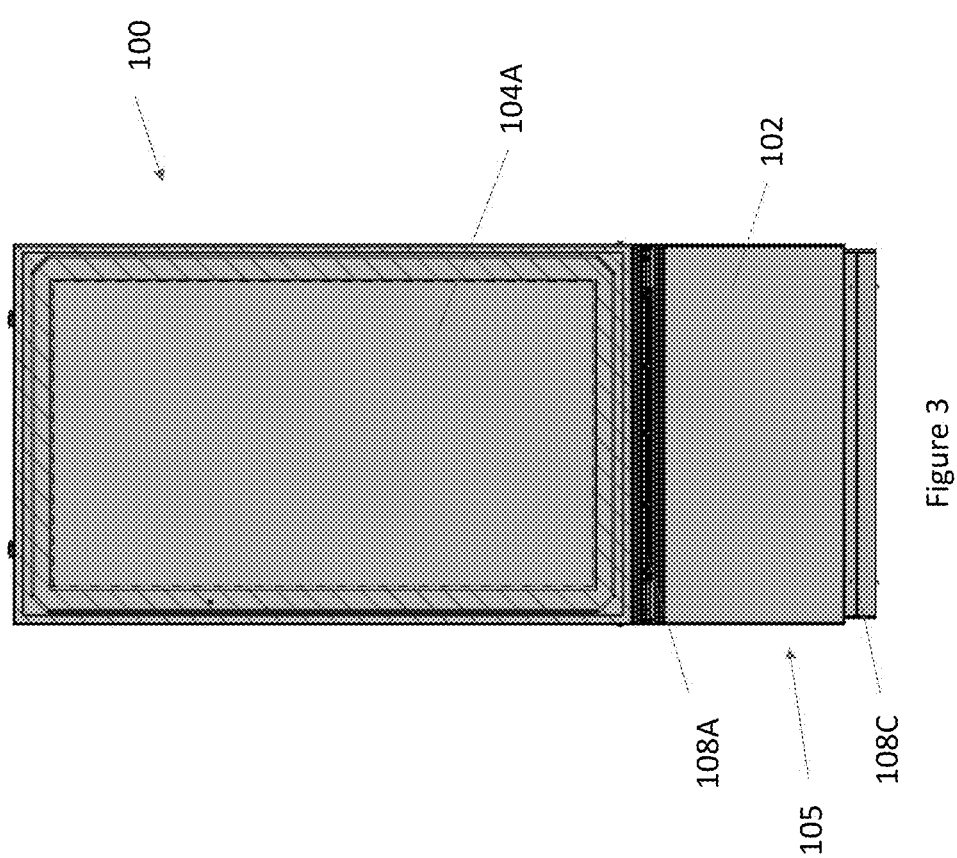
FIG. 3 is a front view of the display assembly of FIG. 1.

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIG. 1 through FIG. 4 illustrate an exemplary display assembly 100. The assembly 100 may comprise a mounting structure 102. The mounting structure 102 may be configured to accept one or more side assemblies 104. The side assemblies 104 sometimes also being referred to electronic display assemblies 104, or individually as an electronic display assembly 104. In exemplary embodiments, without limitation, the mounting structure 102 may be configured to receive a first side assembly 104A on a first side of the mounting structure 102 and a second side assembly 104B on a second side of the mounting structure 102, which may oppose the first side of the mounting structure 102. However, the mounting structure 102 may be configured to accept any number of side assemblies 104 in any arrangement.

The mounting structure 102 may be configured to for connection to a surface, such as but not limited to, a ground surface, a sidewalk, parking lot, a street, a building wall, poles, electrical boxes, transformers, ceilings, floors, combinations thereof, or the like. Alternatively, or additionally, the electronic display assemblies 104 may be configured for mounting directly to a ground surface, a sidewalk, parking lot, a street, a building wall, poles, electrical boxes, transformers, ceilings, floors, combinations thereof, or the like, without the need for a dedicated mounting structure 102, and/or such items may serve as part or all of the mounting structure 102.

The mounting structure 102 may comprise one or more structural members formed into a frame. Any number, size, and/or shape of structural members formed into any size and/or shape frame may be utilized. The mounting structure 102 may comprise one or more cladding components, panels, combinations thereof, or the like. For example, without limitation, the cladding components, panels, or the like may be snap fitted, fastened, adhered, hung, and/or otherwise connected to the structural members to form at least part of a housing.

The mounting structure 102 may comprise one or more apertures or other features configured to accept fasteners, adhesives, structural members, combinations thereof, or the like, for connecting the mounting structure 102 to a surface. The mounting structure 102 may comprise one or more apertures, pass through devices, combinations thereof, or the like, for accepting electrical and/or communication network wires and/or cables, such as for connecting components to utility power and/or communications networks such as the world wide web.

In exemplary embodiments, without limitation, the mounting structure 102 may be configured to accept the side assemblies 104 in a manner which permits movement of the side assemblies 104, such as between a closed position where the side assemblies 104 rest against, and/or are secured to, the mounting structure 102 and an opened position where the side assemblies 104 are moved away from the mounting structure 102. Movement may be provided in a hinging manner or otherwise.

The mounting structure 102 may comprise, or be configured to accept, electric vehicle ("EV") charging equipment 110. In exemplary embodiments, the display assembly 100 may comprise a recessed compartment 116 which extends within a portion of the mounting structure 102 and which is configured to accept certain EV charging equipment 110 such as, but not limited to, cables, connectors, plugs, outlets, user interfaces, point of sale devices, pulleys, retractable coils, combinations thereof, or the like. In exemplary embodiments, a user facing portion of the EV charging equipment 110 may be located at, or within, external facing portions of the recessed compartment 116 while other components of the EV charging equipment 110 may be located at, or within, the mounting structure 102.

The assembly 100 may comprise one or more intake areas 106. In exemplary embodiments, the mounting structure 102 may comprise a first intake area 106B and each of the side assemblies 104 may comprise an additional intake area 106A, 106C, though one or more common intakes 106 may be utilized. The intake areas 106 may comprise, for example, without limitation, one or more apertures, grates, filters, screens, combinations thereof, or the like. The intake areas 106 may be configured to accept ambient air from outside the assembly 100. Alternatively, the mounting structure 102 may comprise the additional intake areas 106A, 106C which may be in fluid communication with the side assemblies 104.

The mounting structure 102 and/or the side assemblies 104 may comprise one or more exhaust areas 108. In exemplary embodiments, without limitation, one of the exhaust areas 108A, 108B may be associated with each of the side assemblies 104A, 104B. For example, without limitation, the exhaust areas 108A, 108B may be provided at a lower portion of the side assemblies 104A, 104B or at the mounting structure 102 along the lower edge of the side assemblies 104A, 104B. A first one of the exhaust areas 108A may be associated with a first one of the side assemblies 104A and located at a first side of the assembly 100 while a second one of the exhaust areas 108B may be associated with a second one of the side assemblies 104B and located at a second side of the assembly 100 in exemplary embodiments, without limitation. Each of the exhaust areas 108A, 108B may be in fluid communication with a respective one of the intake areas 106A, 106C, such that each of the airflows is kept separate, though such is not required. The exhaust areas 108A, 108B may be located elsewhere.

One or more additional exhaust areas 1080, 108D may be provided for the intake area 106B associated with the mounting structure 102. The additional exhaust areas 108C, 108D may be provided at a bottom portion of the mounting structure 102 in exemplary embodiments, without limitation. The additional exhaust areas 108C, 108D may be in fluid communication with the intake area 106B. A first one of the additional exhaust areas 108C may be provided at a first side of the assembly 100 and a second one of the additional exhaust areas 108C may be provided at a second side of the assembly 100, for example, without limitation. The additional exhaust areas 108C, 108D may be located elsewhere.

The exhaust areas 108 may comprise, for example, without limitation, one or more apertures, grates, filters, screens, combinations thereof, or the like. The exhaust areas 108 may be configured to exhaust the ambient air previously ingested through the intake areas 106. In exemplary embodiments, without limitation, each of the exhaust areas 108 may be fluidly connected with just one of the intake areas 106, though common intakes 106 and/or exhausts 108 may be utilized. In other exemplary embodiments, airflow through the assembly 100 may be reversed such that the items shown and/or described as intake areas 106 may serve as exhaust areas 108 and the items shown and/or described as exhaust areas 108 may serve as intake areas 106.

The mounting structure 102 may be configured to interchangeably accept the electronic display assemblies 104, blank covers, static poster holders, combinations thereof, or the like. The electronic display assemblies 104, blank covers, and/or static poster holders may be removed for transportation such that a number of the electronic display assemblies 104, blank covers, and/or static poster holders may be transported in their desired and/or proper orientation, such as with the mounting structure 102. For example, without limitation, all such components may be placed within a single shipping crate in this fashion.

The mounting structure 102, in exemplary embodiments, without limitation, may be first secured at an installation site, such as by passing one or more bolts into an adjacent surface. Power supplies and/or network connectivity wires may be passed into the mounting structure 102, such as but not limited to, by way of one or more pass-through devices, holes, or the like. The electronic display assemblies 104, blank covers, and/or static poster holders may thereafter be installed. The certain components of the assembly 100 may be connected to the power supplies, network connectivity wires, and/or other electronic components, directly or indirectly, as required for operation.

Figure 5:
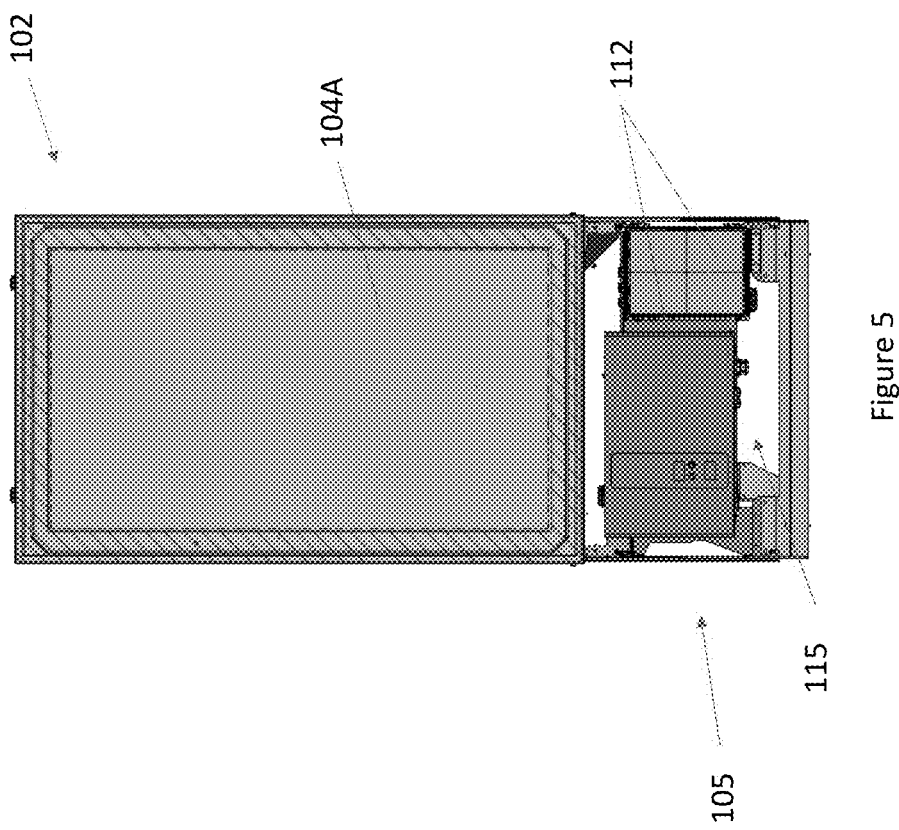
FIG. 5 is a front view of a mounting structure of the display assembly of FIG. 1 with side assemblies installed thereon but certain cladding components removed.

FIG. 5 illustrates the assembly 100 with certain cladding and/or panels removed so as to expose exemplary electronic equipment 112 installed within a lower cavity 115 of a lower area 105. The lower area 105 may comprise an area located below the side assemblies 104 when installed at the mounting structure 102. The lower area 105 and associated lower cavity 115 may be defined, at least in part, by the mounting structure 102.

The electronic equipment 112 may comprise, for example without limitation, EV charging equipment 110 (e.g., power modules, transformers, power distribution modules, power controllers, bulk energy storage devices, AC/DC converters, wiring or cable, combinations thereof, or the like), and/or equipment for side assembly 104 and/or assembly 100 functionality, including but not limited to, power modules, transformers, video players, network connectivity equipment (e.g., wireless transmitters/receivers, routers, radios, antennae, combinations thereof, or the like), sensors (e.g., air quality, pressure, temperature, humidity, accelerometer, magnetometers, combinations thereof, or the like), cameras, microphones, location tracking devices, position measurement systems, communications equipment, electronic storage devices, processors, controllers, edge computing devices, user interfaces, tablet computers, touch screen controllers, point of sale devices, government and/or private equipment (e.g., parking meters, electric meters, utility power supply equipment, traffic controllers, communications network equipment) combinations thereof, or the like.

Any type or kind of electronic equipment 112 may be provided. Various structure for accommodating the electronic equipment 112, such as but not limited to, one or more plates, panels, rails, shelves, server racks, combinations thereof, or the like, may be provided within the lower cavity 115.

Figures 6, 7:
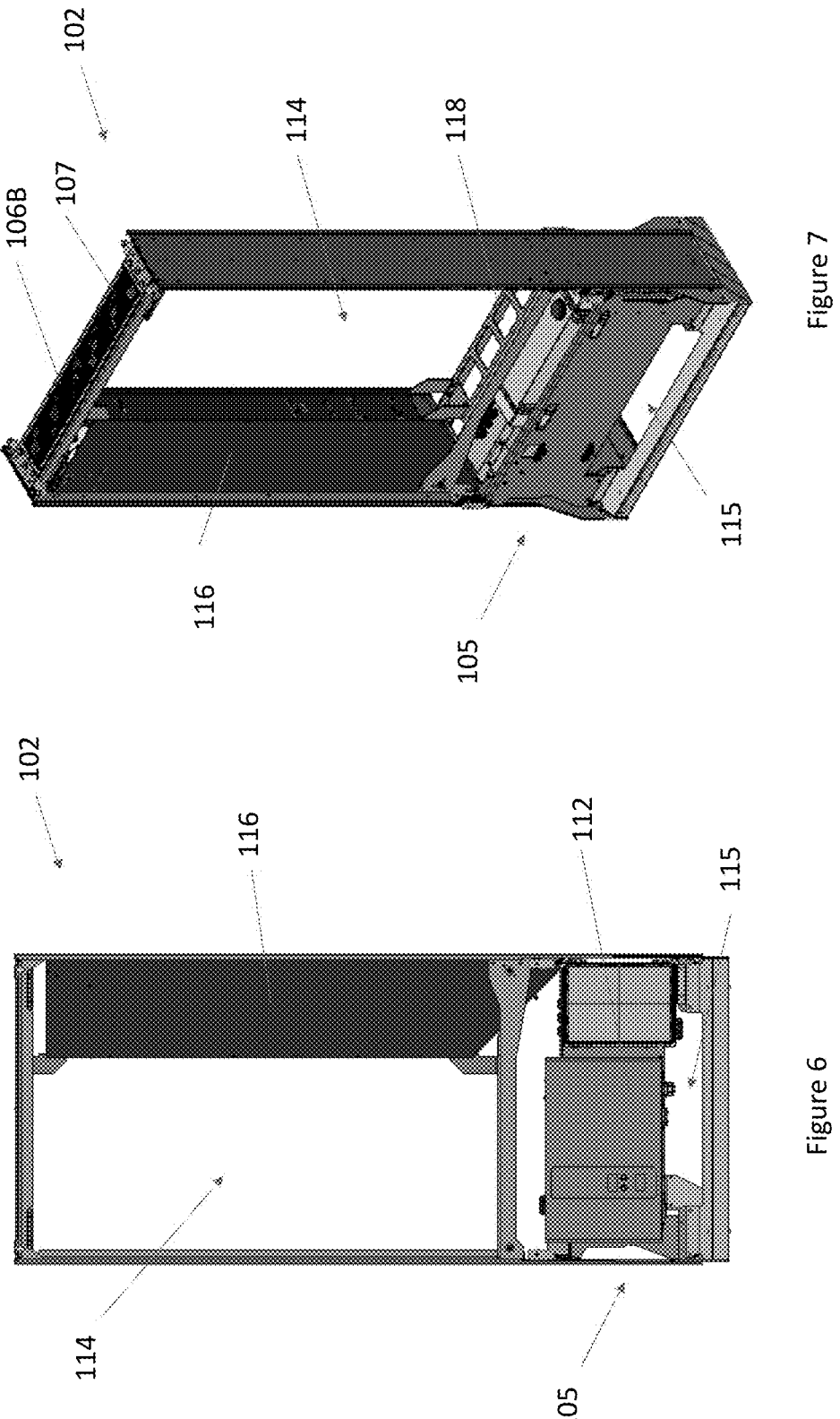
FIG. 6 is a front view of the mounting structure of FIG. 5 with the side assemblies also removed.
FIG. 7 is a perspective view of the mounting structure of FIG. 6.

FIG. 6 and FIG. 7 illustrates the mounting structure 102 with the side assemblies 104 removed. The recessed compartment 116 may be any size and/or shape. In exemplary embodiments, without limitation, the recessed compartment 116 may be sized such that external EV charging equipment 110 is fully recessed within the compartment 116 when properly stowed, though such is not required. The mounting structure 102 may at least partially define an upper cavity 114. The upper cavity 114, in exemplary embodiments without limitation, may be further defined by the side assemblies 104, such as rear surfaces thereof, and the recessed compartment 116. The upper cavity 114 may be located above the lower cavity 115. A series of apertures 118 may extend between the upper cavity 114 and the lower cavity 115 in exemplary embodiments, without limitation. Some or all of the electronic equipment 112 may be located in the upper cavity 114, though such is not required.

The intake area 106B, the upper cavity 114, the lower cavity 115, and/or the exhaust areas 108C and/or 108D may, at least partially, define a central airflow pathway for ambient air. The central airflow pathway may provide a dedicated airflow of ambient air for thermal management of the electronic equipment 112 in exemplary embodiments, without limitation. The central airflow pathway may form an open loop within the assembly 100. The central airflow pathway may be separate from other open loop airflow pathways, such as those provided at the side assemblies 104, such as under various ingress protection ("IP") standards. One or more fan assemblies 107 may be located at the intake area 106B for moving ambient air through the central airflow pathway. Each of the fan assemblies 107 may comprise one or more fans, which may be axial type fans, centrifugal type fans, combinations thereof, or the like.

Figures 8, 9:
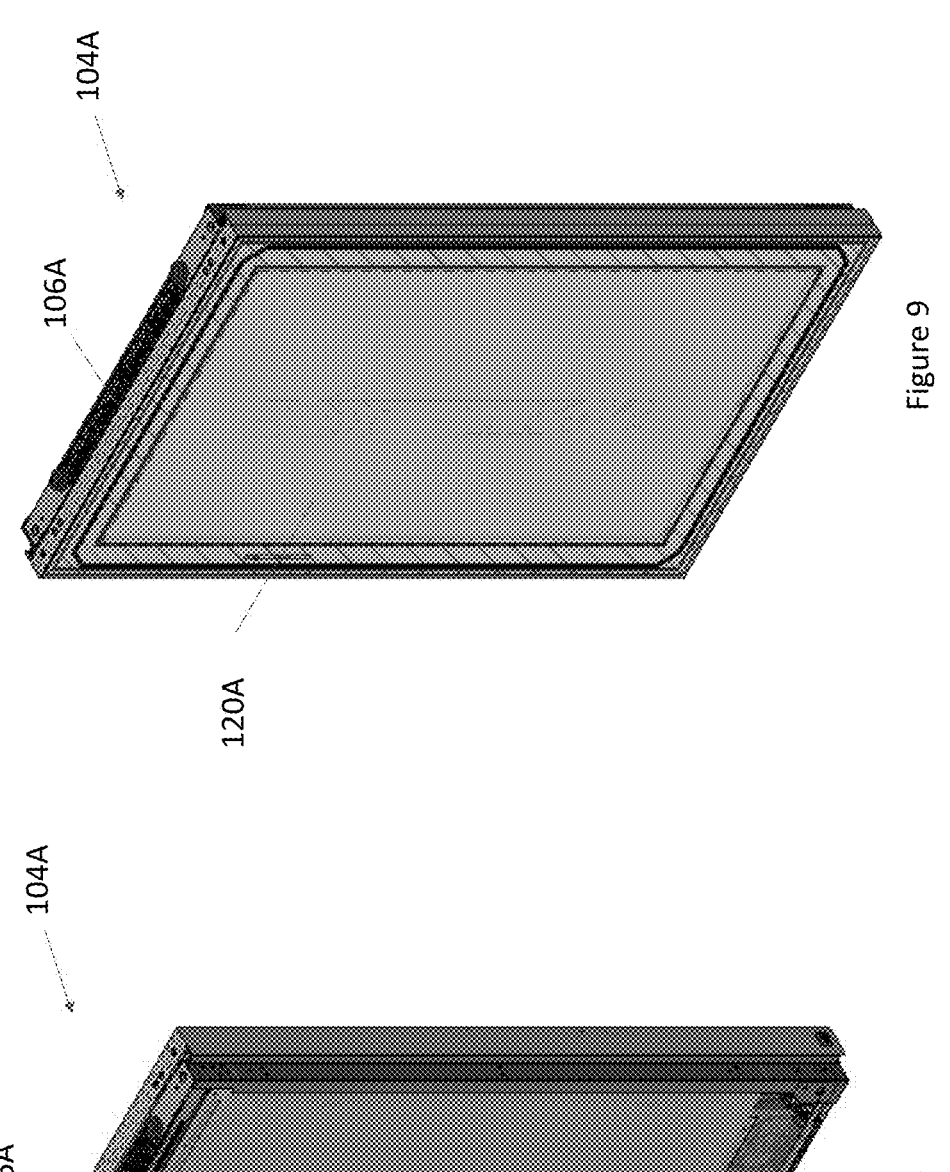
FIG. 8 is a rear perspective view of the side assembly of FIG. 5 illustrated in isolation.
FIG. 9 is a front perspective view of the side assembly of FIG. 8.

FIG. 8 and FIG. 9 illustrate one of the side assemblies 104A, shown in isolation. Each of the side assemblies 104 may comprise the same, or substantially, the same components in the same, or substantially the same, arrangement, though such is not required. Illustration and/or discussion is sometimes made herein with regard to one of the side assemblies 104A, though similar such components may be provided at other ones of the side assemblies 104B with corresponding item numbers with the addition of a "B" (e.g., 124A to 124B, etc.).

The side assembly 104A may comprise one of the intake areas 106A. The side assembly 104A may comprise a rear cover 124A. A series of side assembly exhausts 122A may be located along a lower edge of the side assembly 104A. The side assembly exhausts 122A may be in fluid communication with the exhaust area 108A. The side assembly 104A may comprise a front cover 120A. Additional details of the side assemblies 104 may be as further provided herein.

FIG. 10A through FIG. 11B illustrate various sectional views of the assembly 100, including the side assemblies 104. Each of the side assemblies 104A, 104B may comprise a cover layer 120A, 120B. The cover layers 120 may each comprise multiple layers which are transparent or translucent (e.g., glass, acrylic) and connected by an optically clear adhesive. However, a single layer may be utilized. One or more polarizers and/or anti-reflective films may be provided at forward or rear surfaces of any of the layers of the covers

120. Each of the side assemblies 104A, 104B may comprise a display layer 126A, 126B. The display layers 126 may each comprise one or more liquid crystal cells, though any type or kind of electronic display may be utilized (e.g., plasma, OLED, projection, cathode ray tube, etc.). Each of the side assemblies 104A, 104B may comprise an illumination device 130A, 130B. The illumination device 130 may comprise one or more light emitting diodes ("LEDs") in exemplary embodiments, without limitation. For example, without limitation, multiple LEDs may be mounted to one or more printed circuit boards arranged to provide direct backlighting to the display layers 126, though any type of lighting and/or arrangement (e.g., edge lighting) may be utilized. A corrugated layer 146A, 146B may extend between each of the illumination devices 130 and a second layer 125A, 125B.

A front channel 128A, 128B may extend between the cover layer 120A, 120B and the display layer 126A, 126B of each of the side assemblies 104A, 104B. A rear channel 136A, 136B may extend between the second layer 124A, 124B and the rear covers 124A, 124B. The front channels 128 may be fluidly connected to the rear channels 136 of the respective side assemblies 104. In exemplary embodiments, without limitation, the front channels 128 and rear channels 136 may define a closed loop airflow pathway for circulating gas within a respective one of the side assemblies 104. The closed loop airflow pathway may surround at least the display layer 126 and the illumination device 125. Alternatively, or additionally, a backlight channel 132A, 132B may extend between the display layers 126A, 126B and the illumination devices 130A, 130B of the side assemblies 104. The backlight channels 132 may be fluidly connected to the front and/or rear channels 128, 136 and form part of the closed loop airflow pathway, though such is not required. A cooling channel 148A, 148B may be provided at each of the side assemblies 104A, 104B between the illumination devices 130A, 130B and the second layers 124A, 124B. The cooling channels 148 may be fluidly connected to one of the intakes 106A, 106C and may be configured to accept ambient air and form part of an open loop airflow pathway at each to the side assemblies 104.

Each of the side assemblies 104A, 104B may comprise one or more fan assemblies 148A, 148B, 123A, 123B. Each of the fan assemblies 148, 123 may comprise one or more fans, which may be axial type fans, centrifugal type fans, combinations thereof, or the like. One or more fan assemblies 148 may be placed within the closed loop airflow pathway of the respective one of the side assemblies 104 for moving circulating gas through the respective closed loop airflow pathway when operated. One or more fan assemblies 123 may be placed within the open loop airflow pathway of the respective one of the side assemblies 104 for moving ambient air through the respective one of the open loop airflow pathways, when operated.

A central airflow pathway may extend within the mounting structure 102, such as between the side assemblies 104 in exemplary embodiments, without limitation. The central airflow pathway may comprise the intake area 106B, the upper cavity 114, the lower cavity 115, and/or the exhaust areas 108C and/or 108D. The exhaust areas 108C, 108D may be common or separate, such as on each side of the mounting structure 102. In this fashion, the central airflow pathway may extend through a middle portion of the display assembly 100. This may provide dedicated cooling to the electronic components 112, in exemplary embodiments. As a great number and/or more power intensive electronic equipment 112 is utilized, increased cooling may be required to optimize component performance and/or longevity. This may also raise the display portions of the side assemblies 104, such as to a more ergonomic viewing height.

The side assemblies 104A, 104B may comprise additional electronic components 142A, 142B, such as for operating various components of the display assembly 100 and/or side assemblies 104A, 104B. The additional electronic components may be located within the rear channels 136. The additional electronic components 142 may comprise, for example without limitation, power modules, transformers, video players, network connectivity equipment (e.g., wireless transmitters/receivers, routers, radios, antennae, combinations thereof, or the like), sensors (e.g., air quality, pressure, temperature, humidity, accelerometer, magnetometers, combinations thereof, or the like), cameras, microphones, location tracking devices, position measurement systems, communications equipment, electronic storage devices, processors, controllers, edge computing devices, combinations thereof, or the like.

The side assemblies 104A, 104B may comprise heat exchangers 134A, 134B. The heat exchangers 134 may comprise multiple layers, such as but not limited to, for accommodating ambient air as part of the open loop airflow pathways and circulating gas as part of the closed loop airflow pathways in an alternating, cross-flow arrangement. However, any type or kind of heat exchangers 134 may be utilized. The open loop portions of the heat exchangers 134 may be in fluid communication with the intakes area 106 and exhaust areas 108, and the closed loop portions of the heat exchangers 134 may be in fluid communication with the front, rear, and/or backlight channels 128, 132, and/or 136. The open loop portions of the heat exchangers 134 may be fluidly connected with the cooling channels 148 or separate therefrom.

The closed loop airflow pathways of the various side assemblies 104 may be separated from one another and/or open loop airflow pathways of the assembly 100, such as by partitions, dividers, walls, panels, gaskets, heat exchangers, seals, combinations thereof, or the like. A complete (e.g., gas impermeable) separation or seal is not necessarily required. In exemplary embodiments, the separation may be sufficient to prevent solid and/or liquid particulate from passing therethrough and/or solid and/or liquid particulate above a given size from passing therethrough. For example, without limitation, such separation may be sufficient to meet certain ingress protection code (IPC) standards, such as but not limited to, IP65, IP66, IP67, or the like.

While EV charging equipment 110 is discussed in some places, any type or kind of equipment 112 may be provided at the display assembly 100, such as but not limited to, within the lower portion 105. Such equipment 112 may comprise, for example without limitation, power transformers, traffic control devices, parking meters, street lighting equipment, and/or other civil or government and/or privately owned equipment, combinations thereof, or the like. Alternatively, or additionally, the mounting structure 102 may be modified to accommodate such equipment 112 and/or other structures, including but not limited to, walls or other surfaces. The side assemblies 104 may be utilized independent of the mounting structure 102, such as for direct mounting to walls, buildings, or other structures.

Figures 10A, 10B:
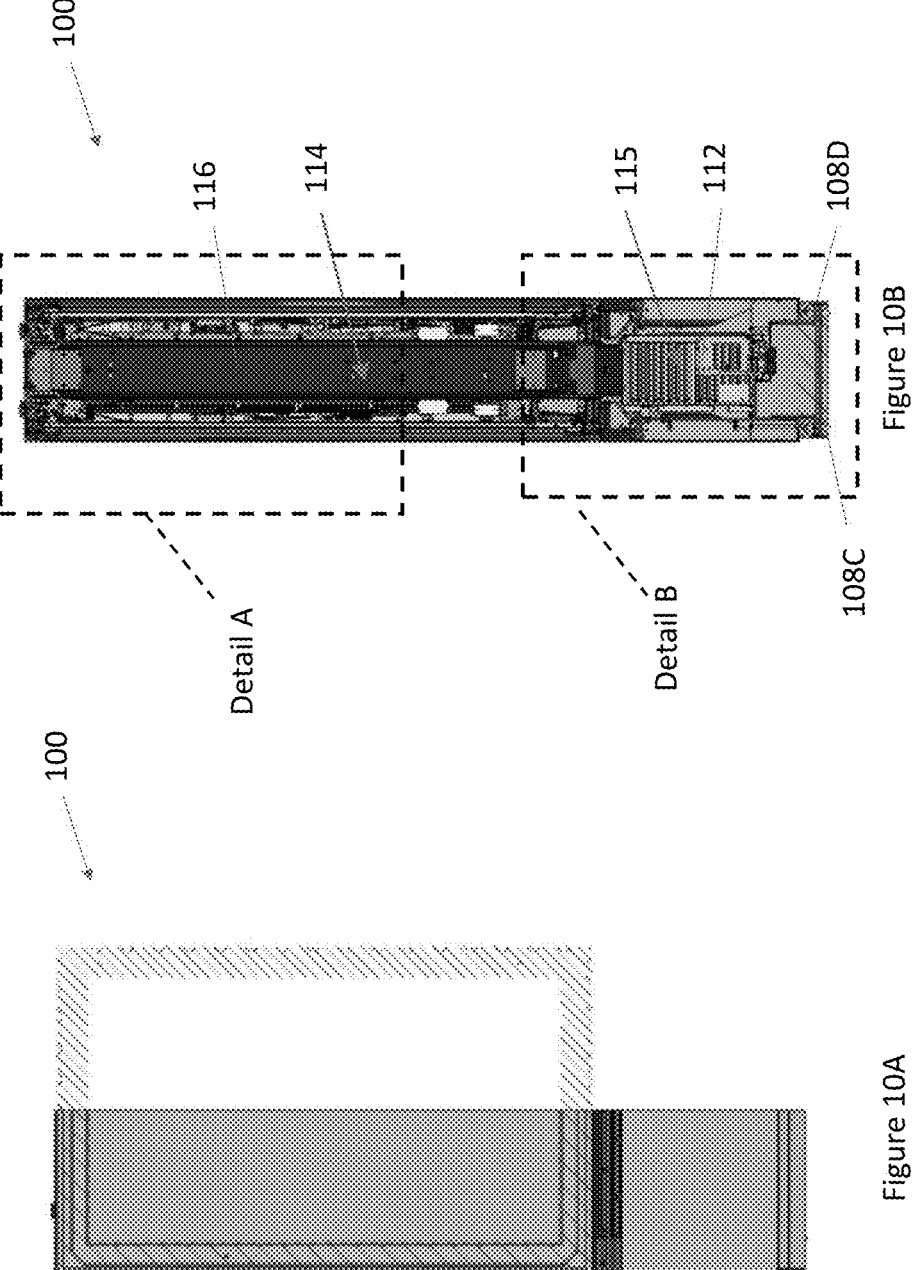
FIG. 10A is a front sectional view of the display assembly of FIG. 1 taken along section line B-B of FIG. 1.
FIG. 10B is a side sectional view of the side assembly of FIG. 10A also indicating detail A and detail B.
Figure 10C:
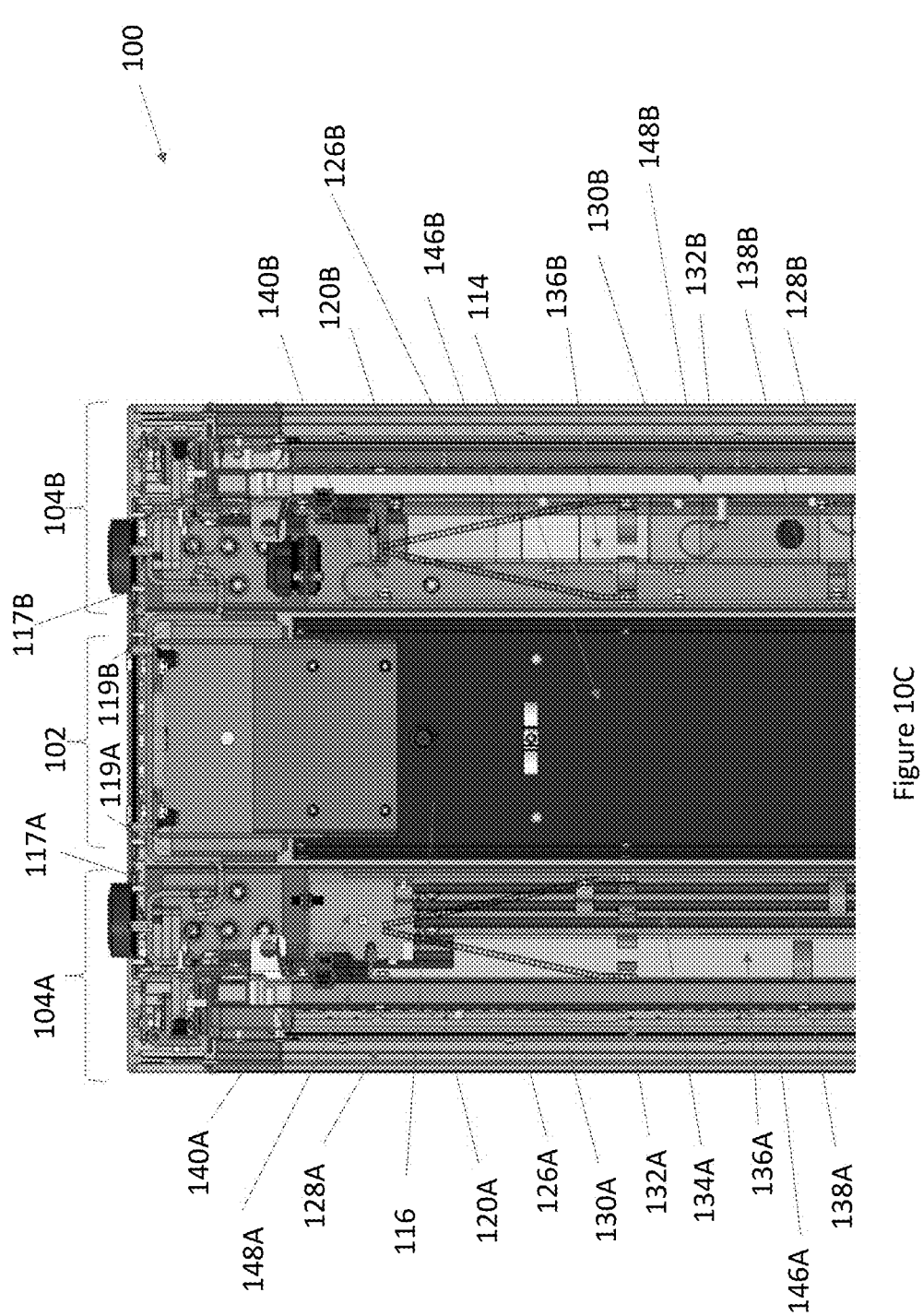
FIG. 10C is a detailed side sectional view of detail A of FIG. 10B.
Figure 10D:
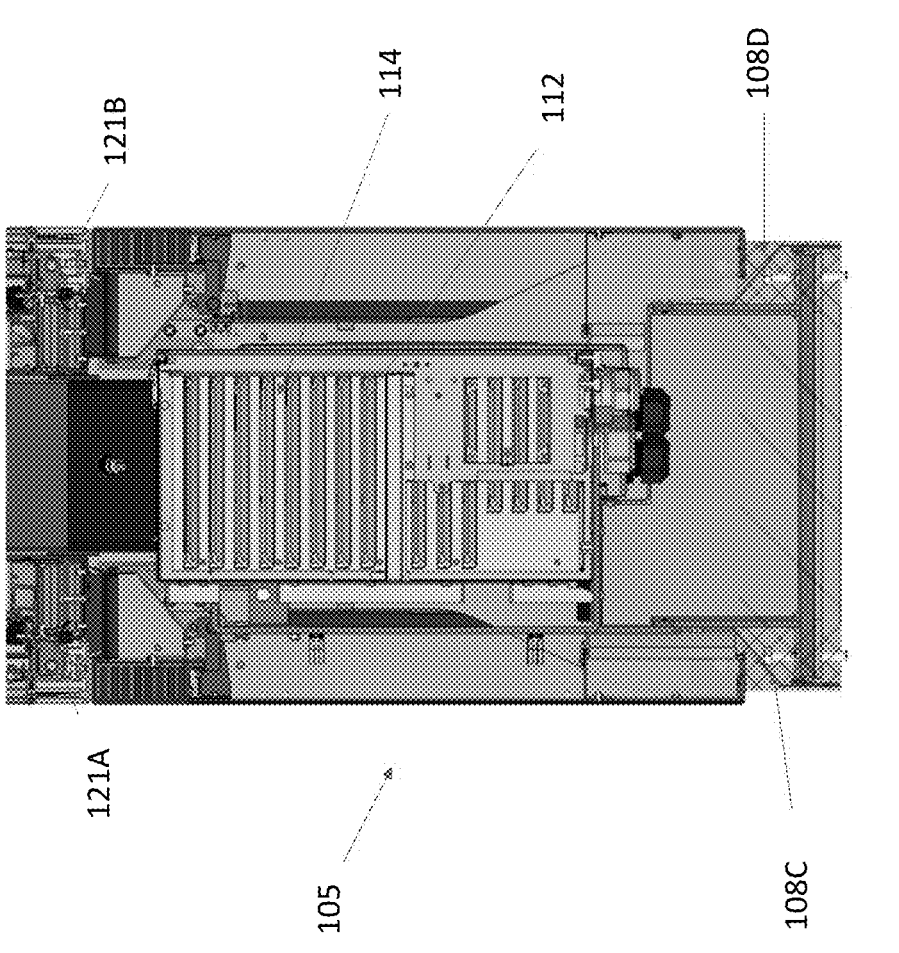
FIG. 10D is a detailed side sectional view of detail B of FIG. 10B.
Figure 10E:
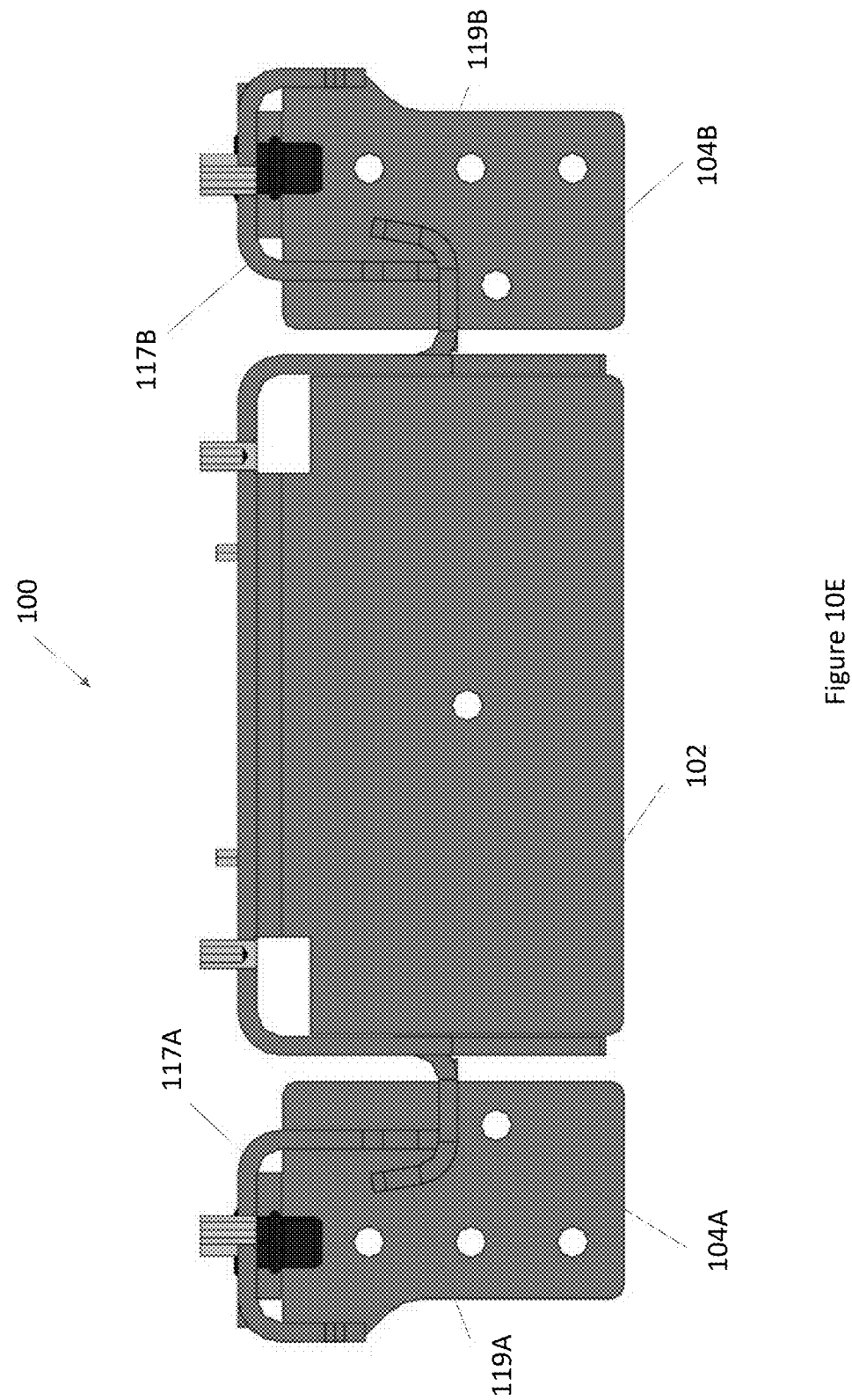
FIG. 10E is a detailed side view of FIG. 10C with certain components shown in isolation.
Figure 11A:
FIG. 11A is a front sectional view of the display assembly of FIG. 1 taken along section line A-A of FIG. 1.
Figure 11A:
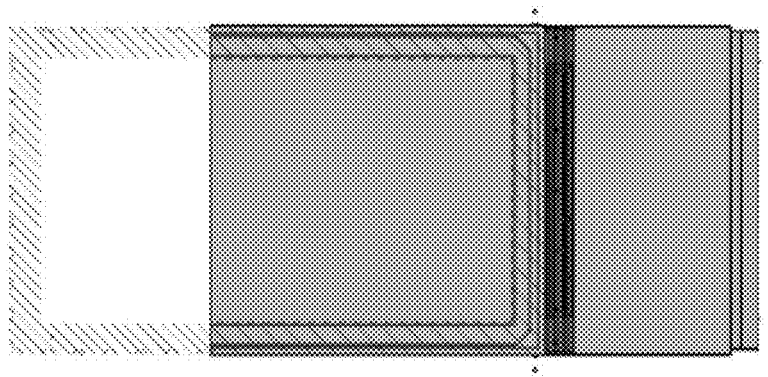
Figure 11B:
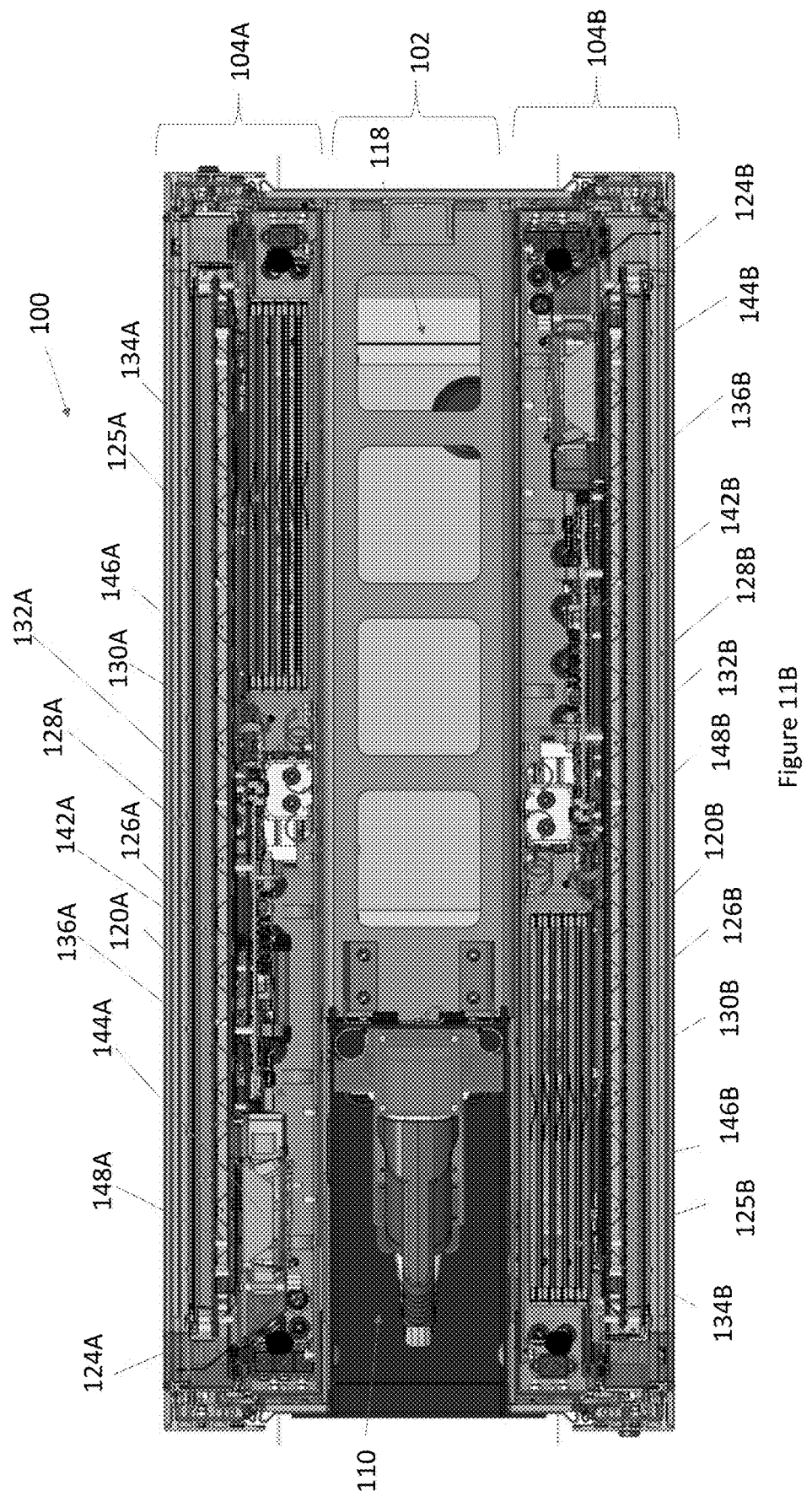
FIG. 11B is a top sectional view taken along section line A-A of FIG. 1.

As illustrated with particular regard to at least FIG. 10E, the side assemblies 104 may comprise one or more mounting devices 117. The mounting devices 117 may comprise holes, pins, hooks, bars, protrusions, combinations thereof, or the like. The mounting devices 117A, 117B of the side assemblies 104A, 104B may be configured to mate with one or more mounting devices 119A, 119B of the mounting structure 102. The mounting devices 119 of the mounting structure 102 may comprise holes, pins, hooks, bars, protrusions, combinations thereof, or the like. The mounting devices 117 and/or 119 may be configured to permit hanging or other mounting of the side assemblies 104 at the mounting structure 102 and/or another surface. Securing devices 121A, 121B may be provided at lower portions of the side assemblies 104A, 104B and/or mounting structure 102 for securing the side assemblies 104 to the mounting structure 102 or other surface, such as when the side assemblies 104 are in a closed position. The securing devices 121 may comprise one or more pins, locks, tabs, latches, fasteners, tie downs, combinations thereof, or the like. In exemplary embodiments, the mounting devices 117, 119 comprise complementary hooks which are configured to selectively mate such that the side assemblies 104 may be removably and/or movably mounted to the mounting structure 102. This may permit ease of mounting.

Figures 12A, 12B, 12C:
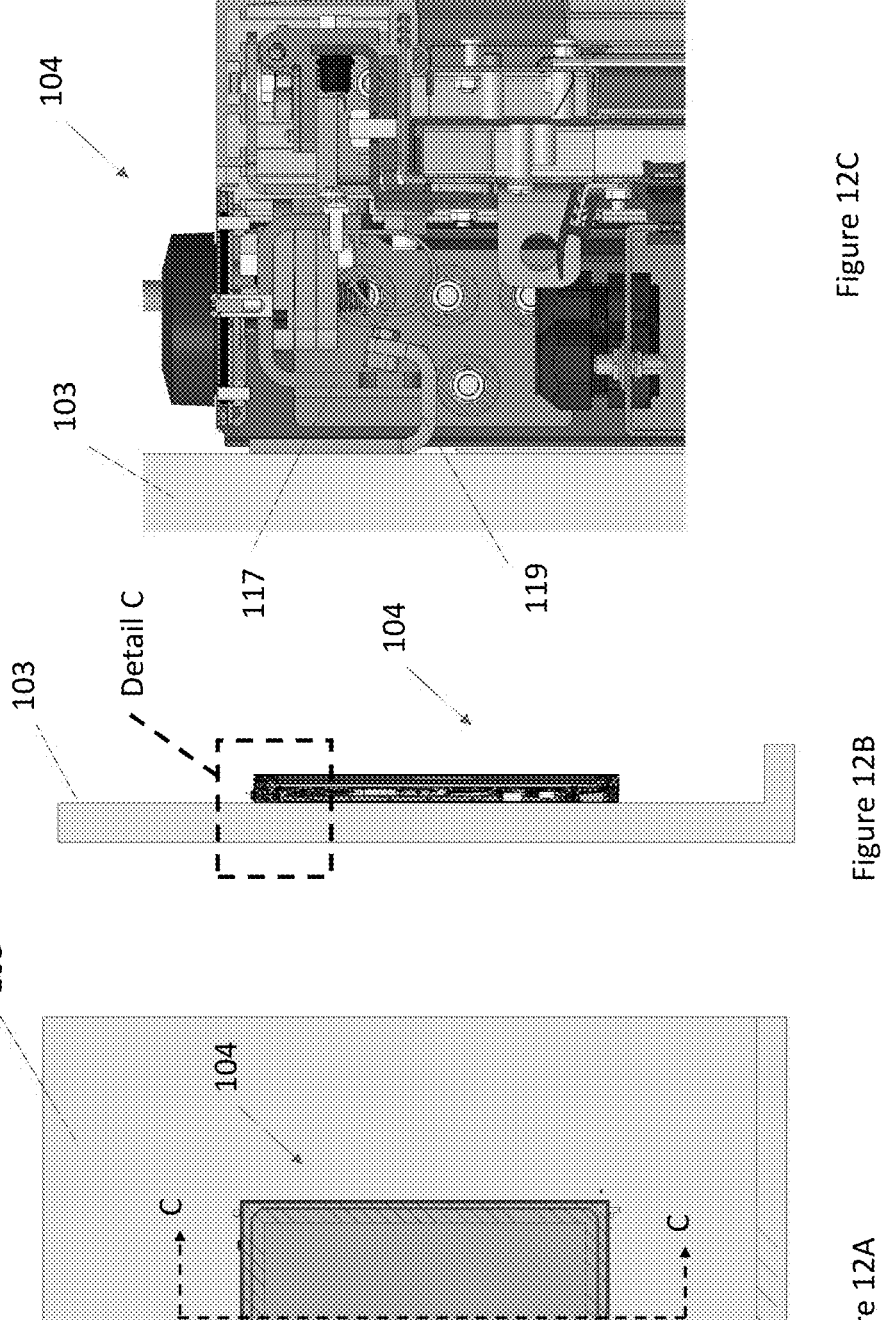
FIG. 12A is a front view of the side assembly separately installed to an exemplary surface in an exemplary fashion.
FIG. 12B is a side sectional view of the installed side assembly of FIG. 12A taken along section line C-C.
FIG. 12C is a detailed side view of detail C of FIG. 12B.
Figure 13B:
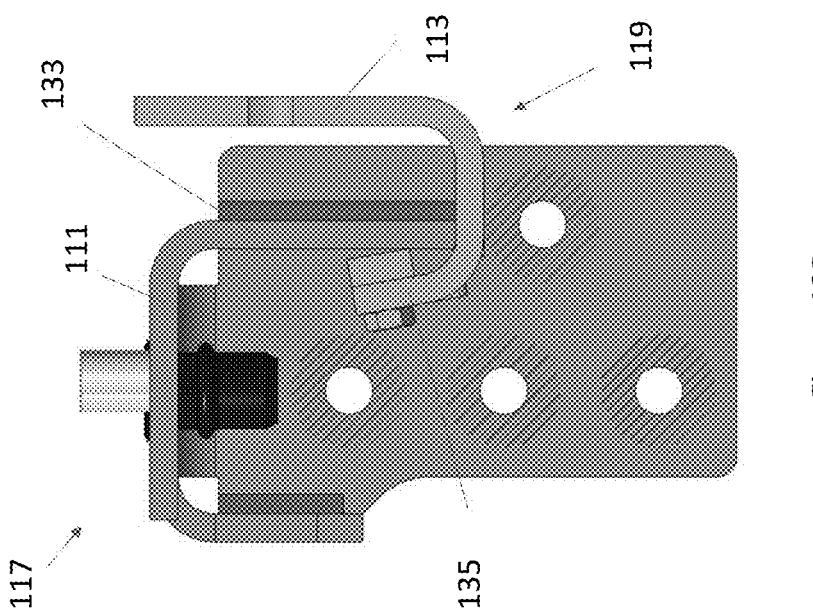
FIG. 13B is a side view of the mounting structure of FIG. 13A.
Figure 13A:
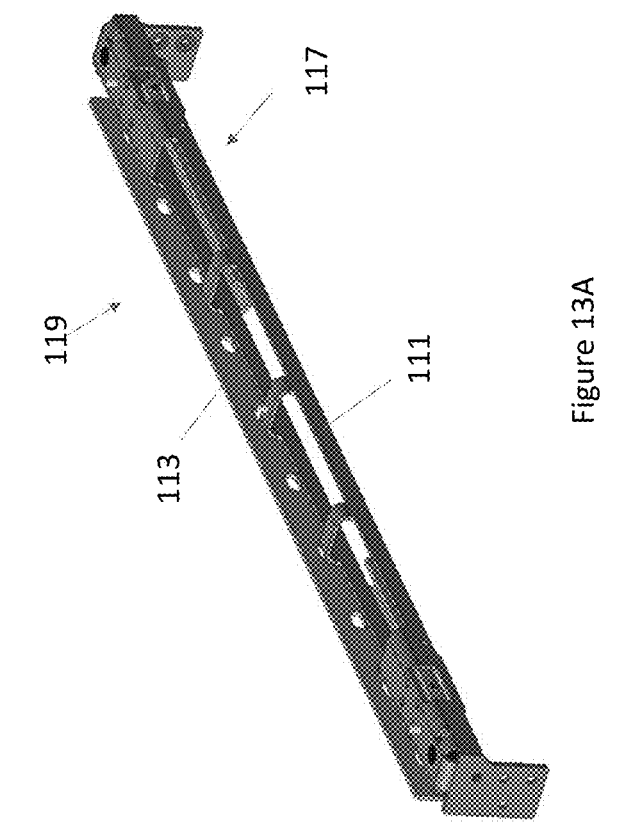
FIG. 13A is a perspective view of an exemplary mounting structure of FIGS. 12A-12C shown in insolation.

FIG. 12A through FIG. 12C illustrate an exemplary embodiment whereby one of the side assemblies 104 is mounted to a surface 103, such as but not limited to a wall by way of the mounting devices 117, 119. The surface 103 may be another object, such as but not limited to the mounting structure 102, in other exemplary embodiments. The surface 103 and/or other object may serve as a mounting point for the side assemblies 104 by way of the mounting device(s) 119 secured to the surface 103 and/or other object and the mounting devices 117 provided at the side assemblies 104. The mounting devices 117, 119 for accomplishing such mounting are further illustrated in at least FIG. 13A through FIG. 13B.

In exemplary embodiments, without limitation, one or more of the mounting devices 119 may be secured to the surface 103 or object. For example, without limitation, fasteners may be passed through portions of the mounting device 119, such as at holes, slots, and/or otherwise solid, fastener permeable material in a laterally extending bracketing portion 113. Alternatively, or additionally, adhesive, welding, or other bonding techniques may be utilized to secure the mounting device 119 to the surface 103 or object. The mounting device 119 may comprise one or more hooked portions 135. The hooked portions 135 may be provided at laterally extending portions 113 of the mounting device 119 in exemplary embodiments. The hooked portions 135 may be provided at either end of the laterally extending portion 113 and/or spaced apart along the same. Preferably, the laterally extending portions 113 are sized to substantially match (e.g., within about 80%-120%) of the lateral width of the cover layer 120 for the side assembly 104. In other exemplary embodiments, each of the hooked portions 135 may form part of a separate mounting device 119. In yet other exemplary embodiments, multiple mounting devices 119, each with one or more hooked portions 135 are utilized with each side assembly 104.

One or more of the mounting devices 117 may be provided at the side assemblies 104. The mounting devices 117, 119 may be complementary, such as to permit removable mounting of the side assembly 104 to the surface 103. The mounting device(s) 117 may comprise one or more hooked portions 133. Preferably, the hooked portions 133 of the mounting devices 117 associated with the side assemblies 104 face and/or are open in a primarily downward direction while the hooked portions 135 of the mounting devices 119 associated with the surface 103 face and/or are open in a primarily upward facing direction. In this fashion, the hooked portions 133 of the mounting devices 117 associated with the side assemblies 104 may be raised above the hooked portions 135 of the mounting devices 119 associated with, and preferably already mounted to, the surface 103 or other object and slid downward to connect, mount, and secure the side assembly 104 to the surface 103 or another object.

The side assemblies 104, in this fashion, may be capable of rotational movement away from the surface 103 or other object, such as to permit access to a rear portion thereof. Alternatively, or additionally, the side assemblies 104 may be removed by upward movement of the side assemblies 104, such as to disengage the mounting devices 117, 119 from one another. Preferably, eye hooks may be provided (permanently or removably, such as by way of threaded apertures) at upper portions of the side assemblies to permit upward movement by attached crane or another device. The side assemblies 104 may be moved laterally outward to clear the mounting devices 117, 119 from each other, then lowered or otherwise moved to another location as desired.

The hooked portions 133 of the mounting devices 117 associated with the side assemblies 104 may be provided at laterally extending portions 111. The hooked portions 133 may be provided at either end of the laterally extending portion 111 and/or spaced apart along the same. Preferably, the laterally extending portions 111 are sized to substantially match (e.g., within about 80%-120%) of the lateral width of the cover layer 120 for the side assembly 104. The mounting devices 117 of the side assemblies 104 may be removably or permanently attached to the side assemblies 104 and/or integrally formed therewith.

One or both of the laterally extending portions 111, 113 may comprise apertures, such as for reduced weight, airflow, and/or accepting fasteners for securing the mounting devices 111, 113 to the surface 103 and/or other portion of the side assembly 104.

Figures 14A, 14B, 14C:
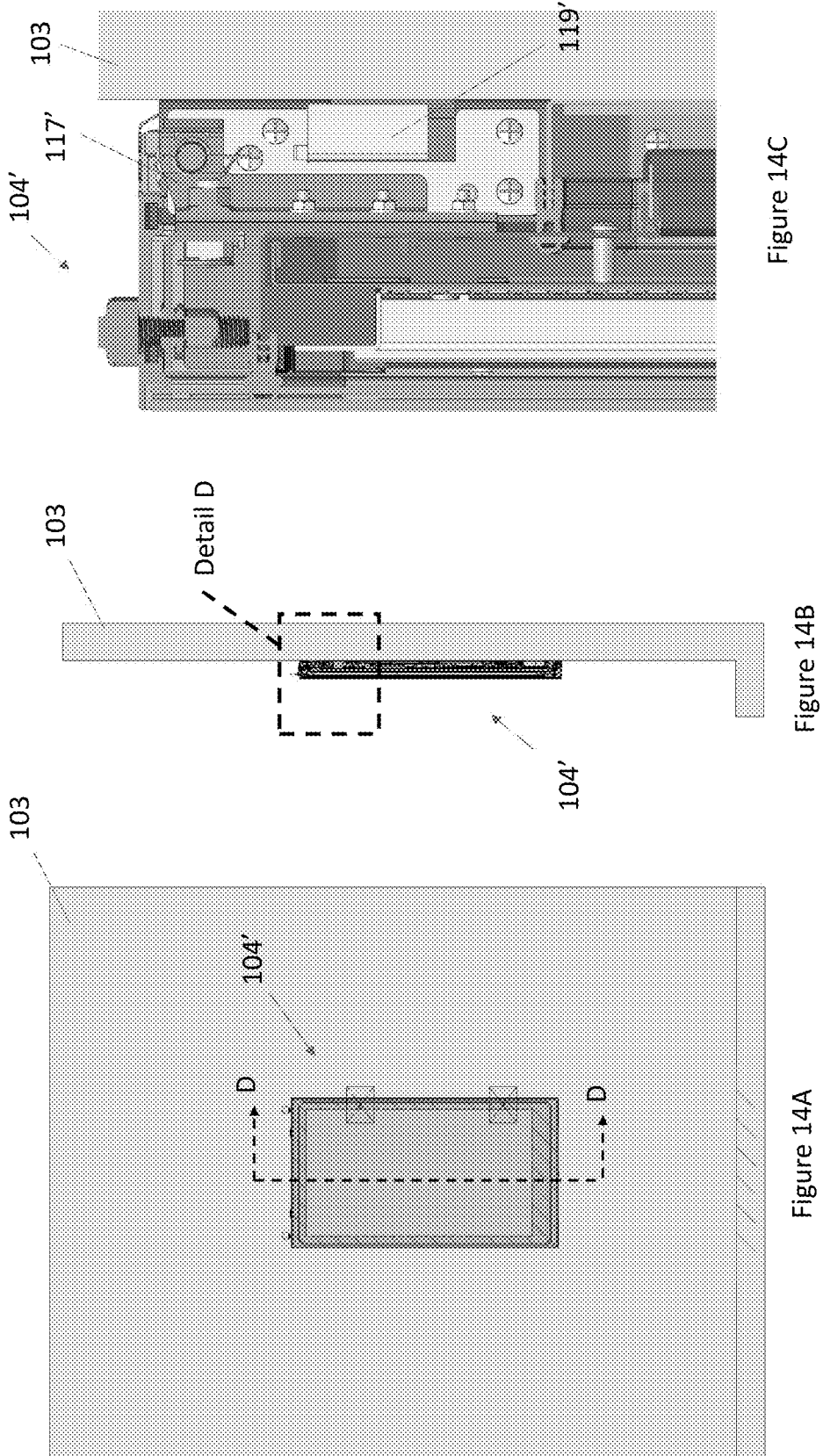
FIG. 14A is a front view of another exemplary embodiment of the side assembly separately installed to the exemplary surface in another exemplary fashion.
FIG. 14B is a side sectional view of the installed side assembly of FIG. 14A taken along section line D-D.
FIG. 14C is a detailed side view of detail D of FIG. 14B.
Figures 15A, 15B:
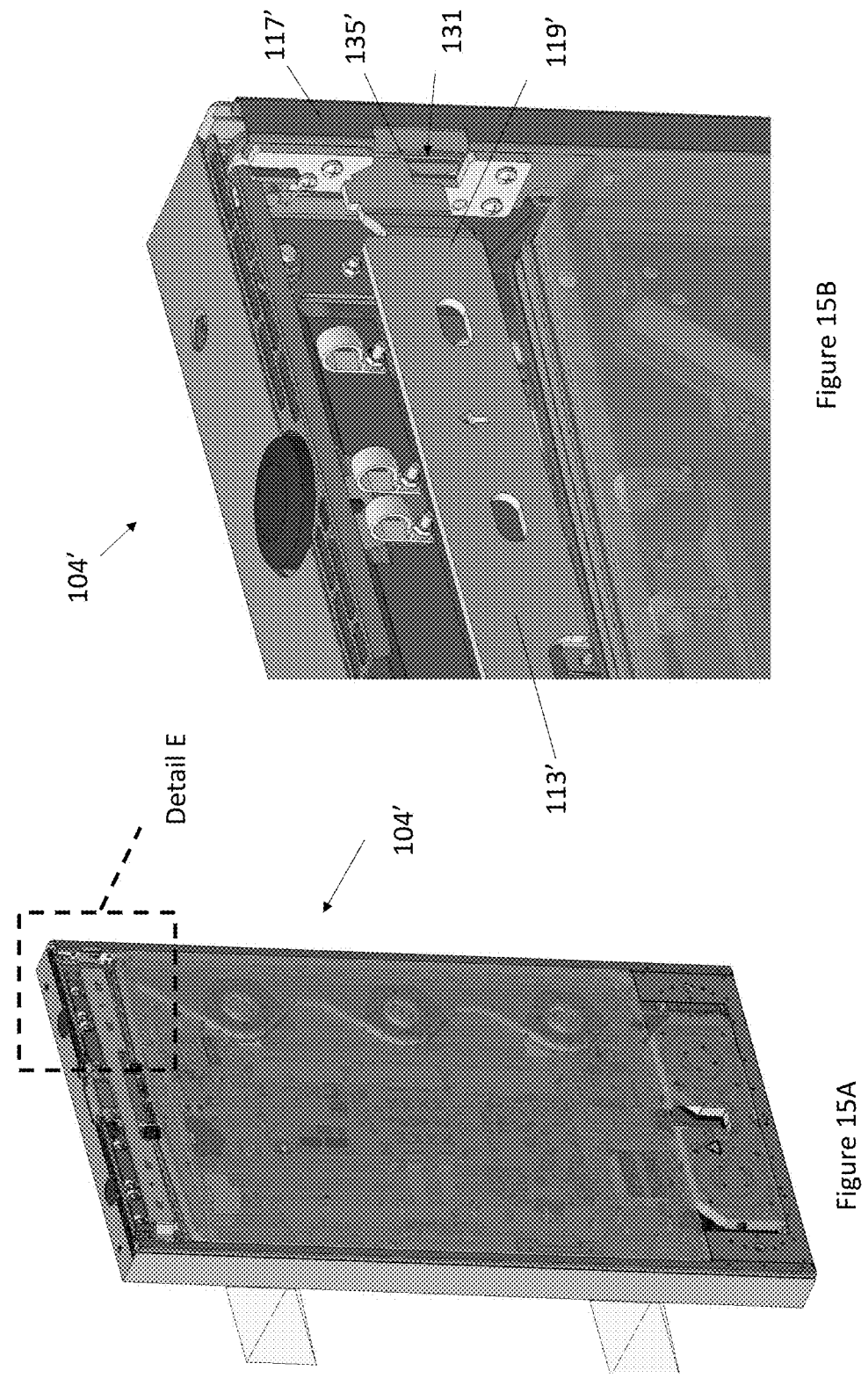
FIG. 15A is a perspective view of an exemplary mounting structure of FIGS. 14A-14C shown in insolation.
FIG. 15B is a detailed perspective view of the mounting structure of detail E of FIG. 15A.
Figure 15D:
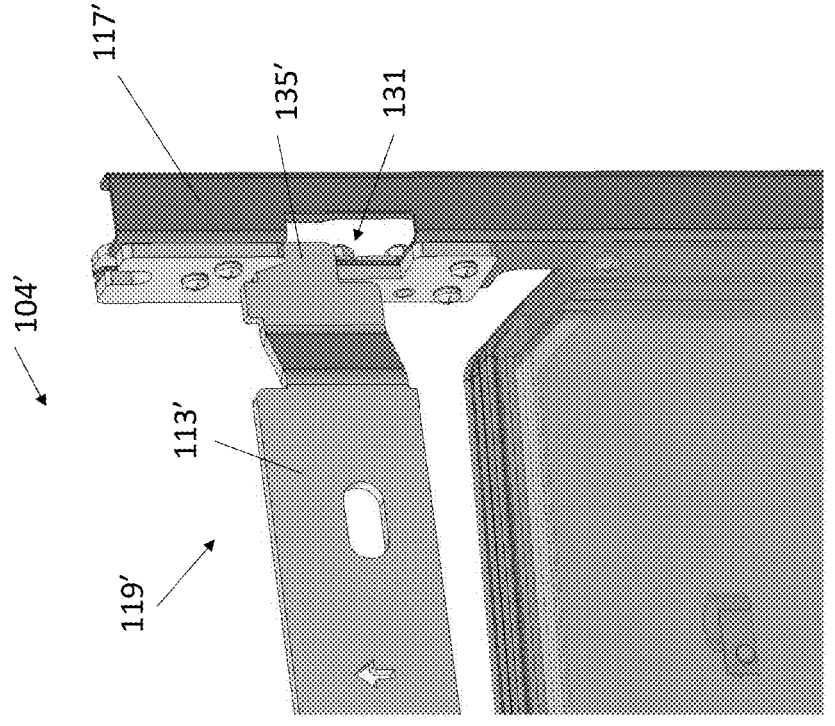
FIG. 15D is a detailed perspective view of the mounting structure of FIGS. 15A-15B with certain components not illustrated so that other features may be better seen.
Figure 15C:
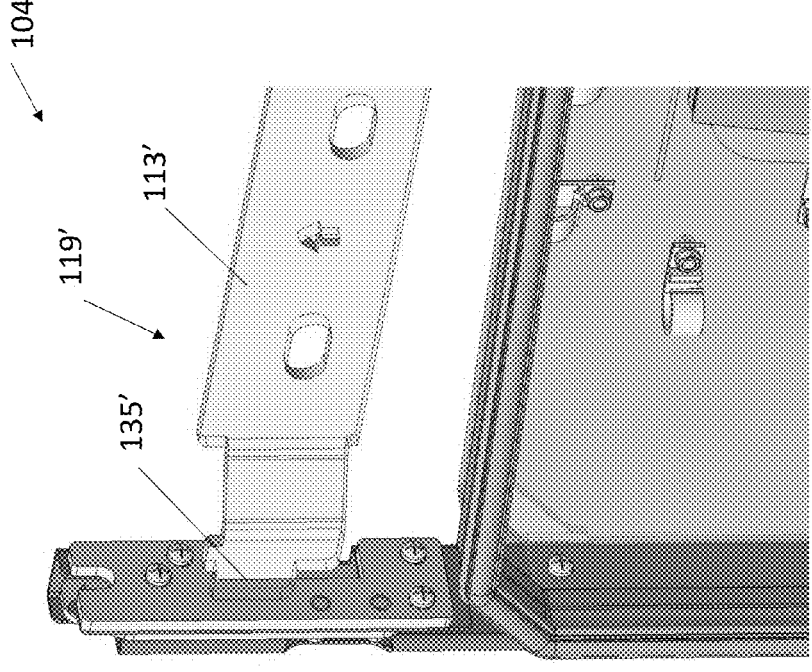
FIG. 15C is a detailed perspective view of the mounting structure of FIGS. 15A-15B with certain components not illustrated so that other features may be better seen.
Figure 16A:
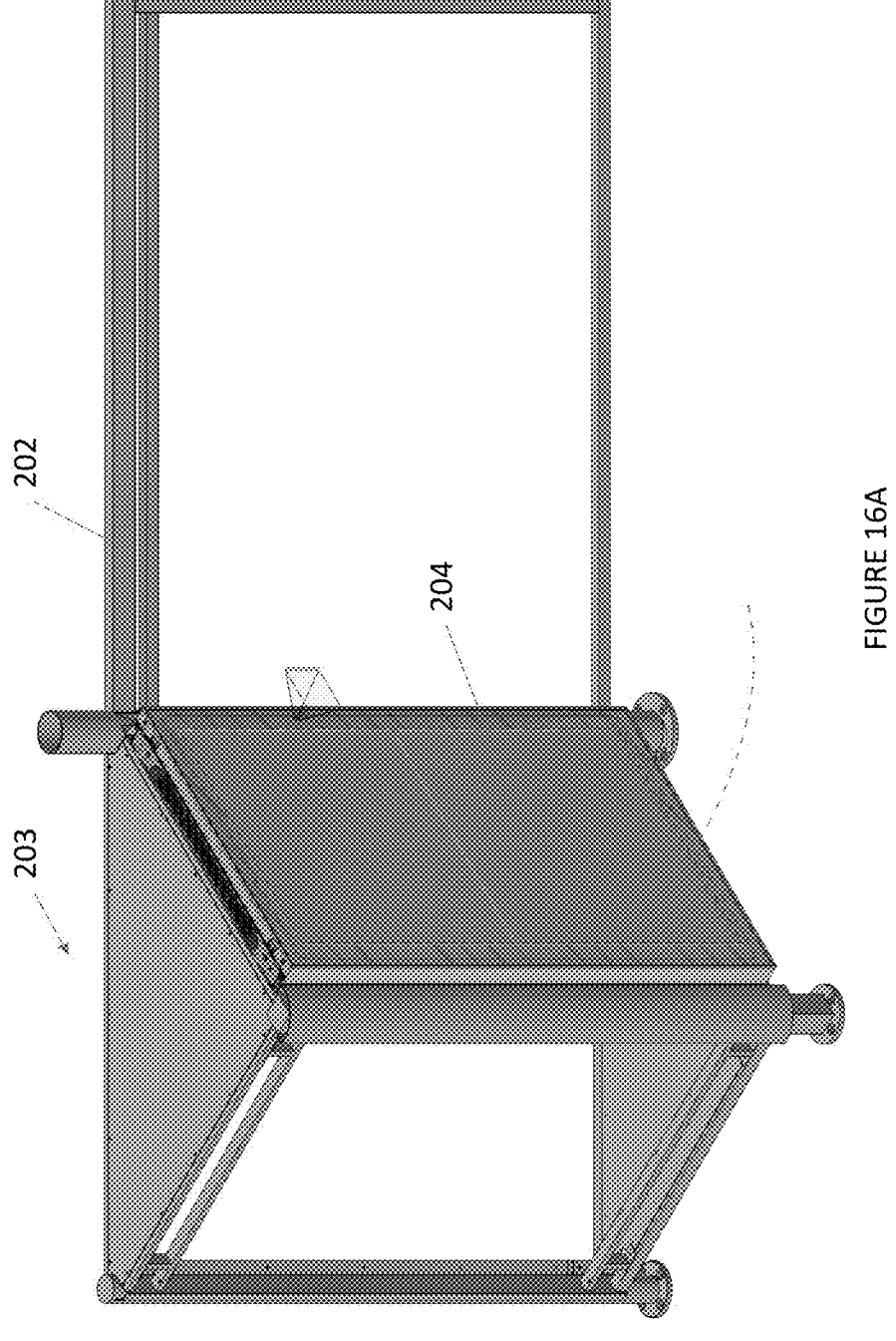
FIG. 16A is a perspective view of an exemplary mounted display.
Figure 16C:
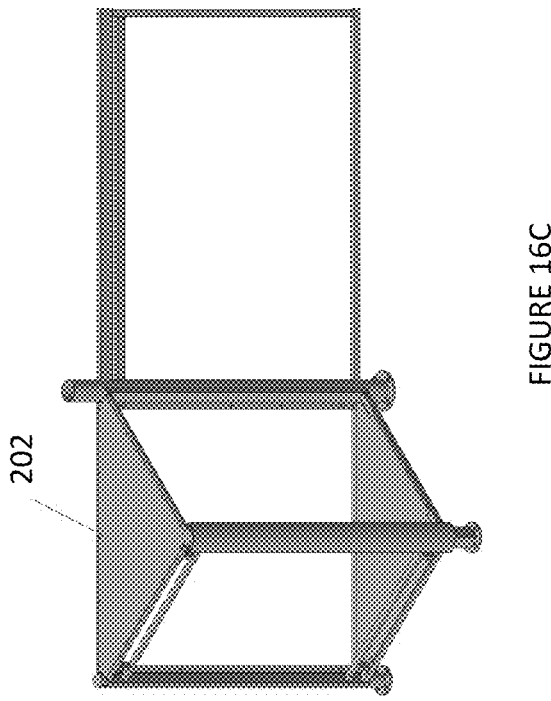
FIG. 16C is the perspective view of FIG. 16B with the mounting structure further retrofitted.
Figure 16B:
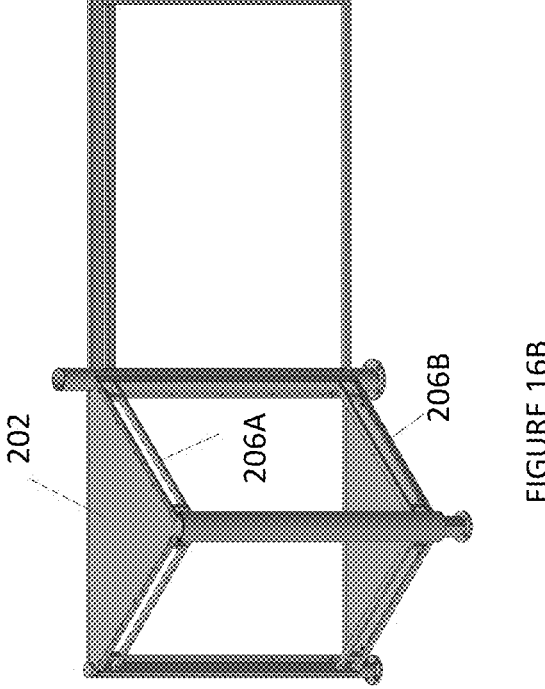
FIG. 16B is a perspective view of an exemplary mounting structure of FIG. 16A partially retrofitting to accommodate an exemplary display assembly.
Figure 16E:
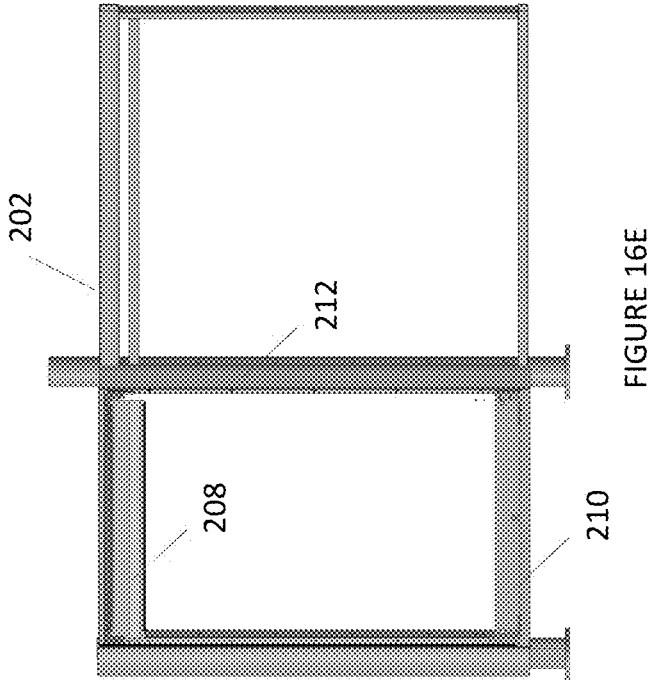
FIG. 16E is the perspective view of FIG. 16D with the mounting structure further retrofitted.
Figure 16D:
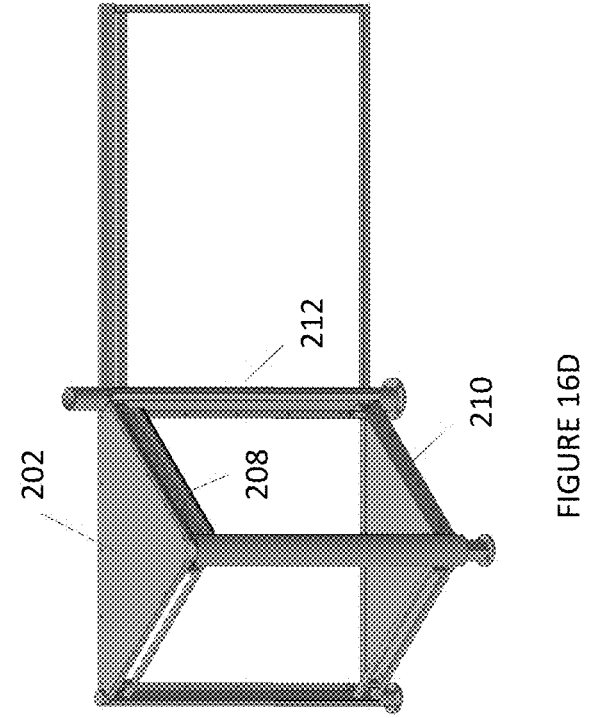
FIG. 16D is the perspective view of FIG. 16C with the mounting structure further retrofitted.
Figure 16F:
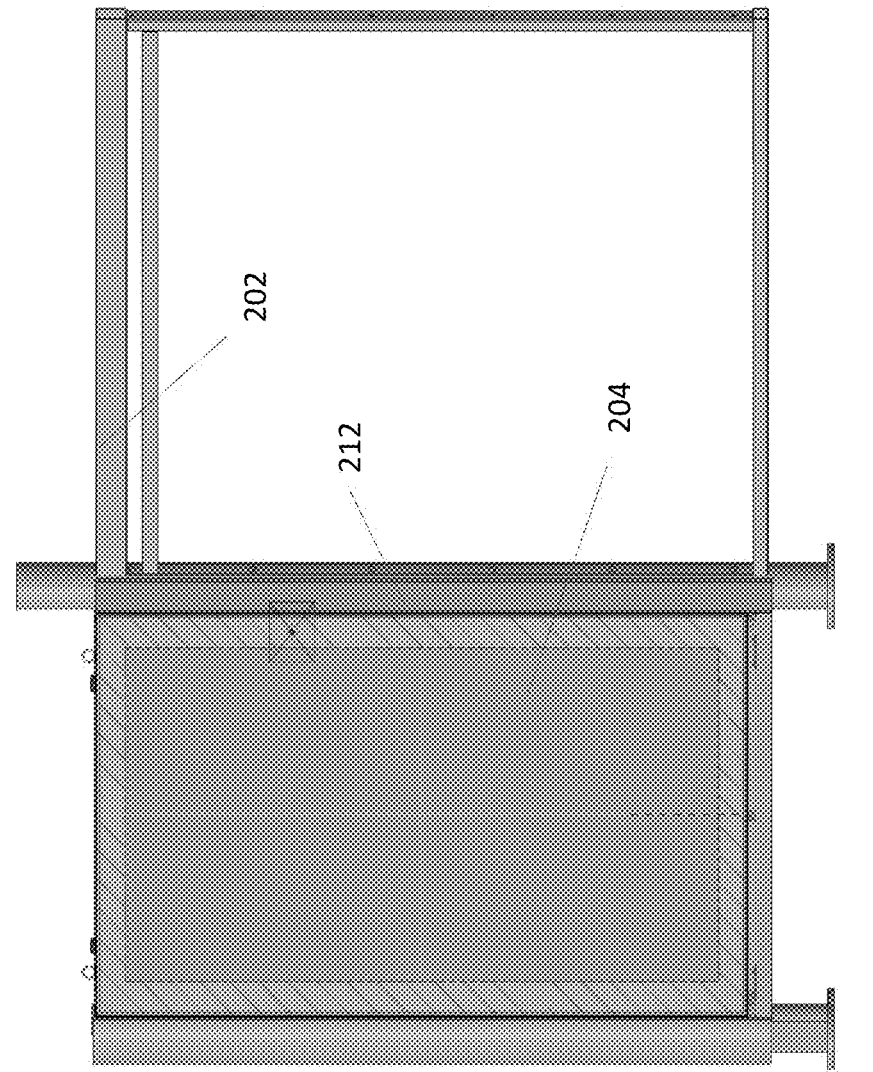
FIG. 16F is a side view of the mounted display of FIG. 16E.

FIG. 14A through FIG. 14C illustrate another exemplary embodiment whereby other exemplary mounting devices 117', 119' are used to mount other exemplary side assemblies 104' to the same or other surfaces 103 or other object(s). Same or similar components may be numbered similarly but with the addition of a prime (') (e.g., 117 to 117'). These mounting devices 117', 119' may be, for example without limitation, preferably used with relatively smaller size side assemblies 104' with relatively smaller size displays. These side assemblies 104' may be relatively lighter and thus reduced size mounting devices 117', 119' may be utilized in some embodiments.

In exemplary embodiments, without limitation, the mounting devices 117' associated with the side assemblies 104' may comprise one or more apertures 131, which may be formed as slots. The apertures 131 may be configured to accept hooked portions 135' of the mounting device 119' associated with the surface 103 or other structure. The hooked portions 135' may be provided at either end of a laterally extending portion 113'. The mounting devices 117' associated with the side assembly 104 may be provided at either side of the side assembly 104 to receive the hooked portions 135' in the apertures 131. Two mounting devices 117', in exemplary embodiments, may be provided at each side assembly 104 with a single mounting device 119' associated with the surface 103. The hooked portions 135' may extend laterally and/or depth wise to engage the apertures 131 which may be open in a lateral direction by way of non-limiting example.

Any size, shape, number, and/or kind mounting device 117, 119, 117', 119' with any size, shape, number, and/or kind of components may be provided in any arrangement, preferably in a complementary fashion to permit removable mounting of the side assemblies 104, 104' to surfaces 103. After mounting, the side assemblies 104, 104' may be connected to external power supply and/or communication as need for operation. However, as the side assemblies 104, 104' may be otherwise independent (e.g., self-contained from an airflow perspective), the mounting devices 117, 119, 117', 119' may provide easy of mounting and removal.

The mounting devices 119, 119' may be mounted to one a wall, building, item of street furniture (e.g., a bus shelter, junction box, telephone booth, lamp pole, etc.), or other surface. In this fashion, the side assembly 104 may be so mounted to various locations. In exemplary embodiments, without limitation, the mounting devices 119, 119' may be connected to and/or integrally formed with, laterally support members for such walls, buildings, items of street furniture, or the like. For example, without limitation, the laterally extending portions 113, 113' of the mounting devices 119, 119' may comprise laterally extending support members of a bus shelter.

FIG. 16A through FIG. 16F illustrate an exemplary embodiment whereby a display unit 204 is mounted to an existing bus shelter 202. While a bus shelter 202 is discussed, other structures may be utilized, such as but not limited to, various items of street furniture. The display unit 204 may comprise some or all of the components of the side assemblies 104, 104' and/or display assembly 100. Furthermore, while an approach for retrofitting existing bus shelters 202 is sometimes shown and/or discussed, the components, systems, apparatus, methods, and/or the like may be used for new structures.

Bus shelters 202 and/or other structures sometimes comprise areas 203 for mounting advertising or other signage, such as static poster holders. As illustrated with particular regard to at least FIG. 16B, the areas 203 may comprise upper and/or lower rails 206A, 206B for mounting static poster holders and related components. As illustrated with particular regard to at least FIG. 16C, a retrofitting process may comprise removing such rails 206A, 206B and related components. As illustrated with particular regard to at least FIGS. 16D-16E, the retrofitting process may comprise installing an upper panel 208, a lower panel 210, and/or one or more side panels 212 to the area 203. As illustrated with particular regard to at least FIG. 16F, the display unit 204 may be installed to the area 203.

FIG. 17A through FIG. 17F illustrate the mounted display unit 204 in further detail. As illustrated with particular regard to at least FIGS. 17A and 17C, side brackets 214A may be provided which attach the upper panel 208 to the existing structure 202. A corresponding side bracket 214A may be provided on each side (right and left) of the display unit 204 in exemplary embodiments, without limitation. A mounting device 219 may be attached to the existing structure 202, the side panel 214A, and/or the front panel 208. The mounting device 219 may comprise a preferably upward facing hook portion configured to interact with a mounting device 217 within the display unit 204, which preferably faces downward. Other orientations, including the reverse, may be utilized.

The mounting device 219, 217 may facilitate hanging the display unit 204 from the structure 202. The mounting device 219 may be secured to one or more of side members and/or an upper member of the structure 202. The side brackets 214 may be secured to the side members of the structure 202. The upper panel 208 may be provided, at least in part, to ensure that most or all ambient air is drawn from a space above the structure 202, for example because the air within the area 203 may be relatively warm. The upper panel 208 may be adapted to draw air from various areas, such as with other structures 202. A gasket may be provided at the upper panel 208 to enhance sealing and/or separation of airflows.

Figures 17D, 17E, 17F:
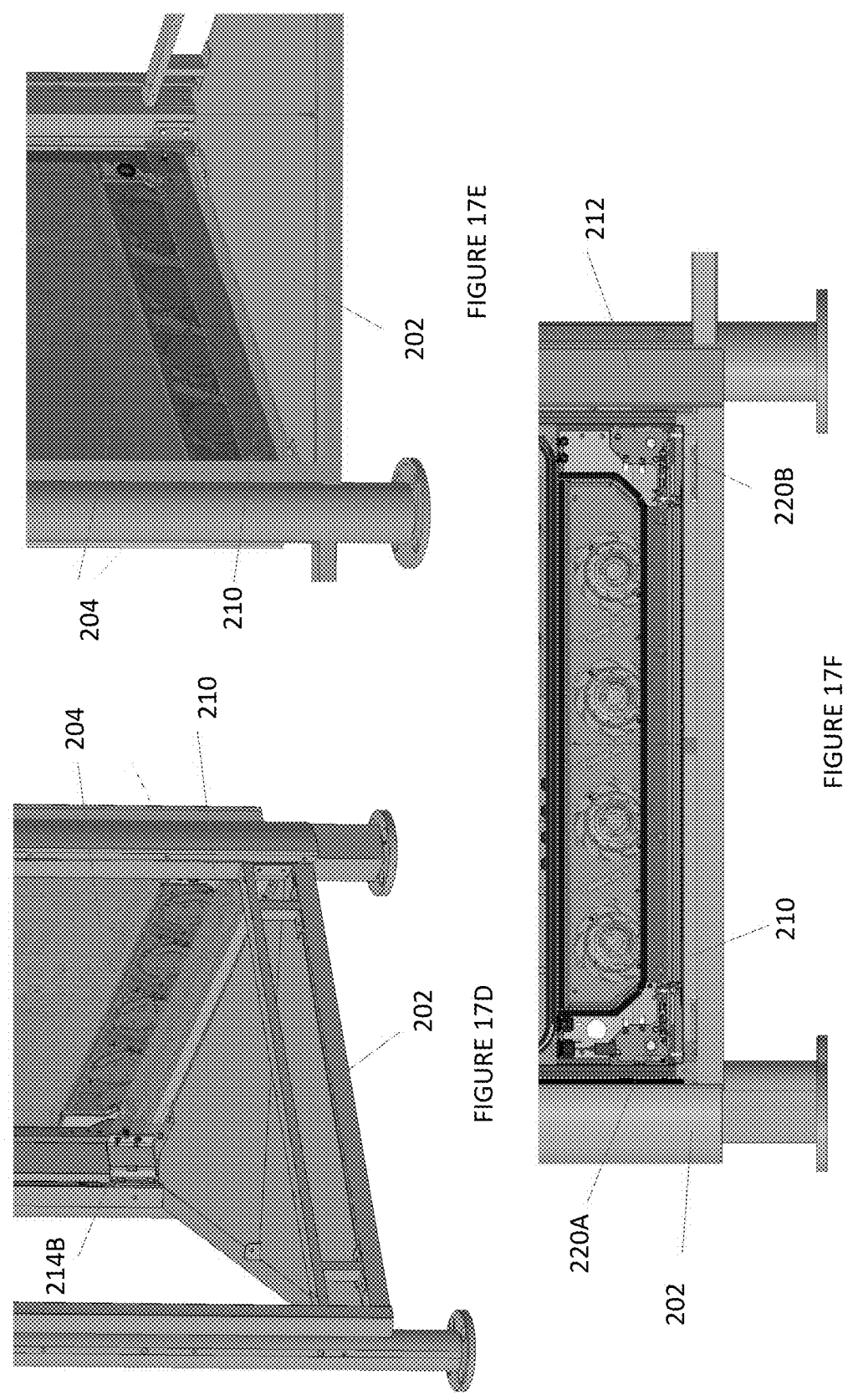
FIG. 17D is a detailed rear perspective view of the mounted display of FIGS. 16A and 16F.
FIG. 17E is another detailed rear perspective view of the mounted display of FIG. 17D.
FIG. 17F is a detailed rear view of the mounted display of FIG. 17D.

As illustrated with particular regard to at least FIGS. 17D-17F, side brackets 214B may be provided at a lower portion of the structure 202, such as to secure the lower panel 210. The lower panel 210 and/or side brackets 214B may serve as a mounting point for a lower portion of the display unit 204, which may be secured by one or more bolts or other fasteners through the lower panel 210 and/or side brackets 214B.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention.

Certain operations described herein may be performed by one or more electronic devices. Each electronic device may comprise one or more processors, electronic storage devices, executable software instructions, combinations thereof, and the like configured to perform the operations described herein. The electronic devices may be general purpose computers or specialized computing devices. The electronic devices may comprise personal computers, smartphone, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A system for mounting display assemblies, said system comprising:
   a first mounting device comprising a first complementary portion extending, at least primarily, in a first vertical direction and a first horizontal direction to provide an opening in a first direction; and
   a side assembly comprising a display layer, a backlight, and a second mounting device located, at least in part, rearward of at least a viewing surface of the display layer, said second mounting device comprising a second complementary portion extending, at least primarily, in a second, opposing vertical direction and a second, opposing horizontal direction to provide an opening in a second direction;
   wherein the first mounting device receives the side assembly by complementary engagement of the first complementary portion and the second complementary portion such that the second complementary portion is received, at least in part, within the first complementary portion by way of the openings thereof, and the first complementary portion overlaps, at least in part, with the second complementary portion in a vertical and a horizontal direction, said complementary engagement securing the side assembly to the first mounting device in a removable fashion.

2. The system of claim 1 wherein:
   the first complementary portion comprises a first set of one or more hook shaped portions.

3. The system of claim 1 wherein:
   the first mounting device is configured to receive the side assembly in the complementary engagement by raising the side assembly relative to, and independently from, the first mounting device such that said second complementary portion of said second mounting device is positioned to clear the first complementary portion of the first mounting device, moving the side assembly laterally rearward such that the second complementary portion of the second mounting device at least partially overlap the first complementary portion of the first mounting device, and lowering the side assembly to engage the first complementary portion of the first mounting device with the second complementary portion of the second mounting device.

4. The system of claim 3 further comprising:
   eyehooks provided to the side assembly for connecting the side assembly to a crane for raising the side assembly.

5. The system of claim 1 wherein:
   said first mounting device comprising a first laterally extending portion from which the first complementary portion extends; and
   said second mounting device comprising a second laterally extending portion from which the second complementary portion extends.

6. The system of claim 5 wherein:
   the side assembly comprises a cover;
   the display layer is located behind the cover; and
   the first and second laterally extending portions have same or different lengths, each of which is within 80%-120% of a width of the cover.

7. The system of claim 5 wherein:
   the first laterally extending portion comprises holes for receiving fasteners for connecting the first mounting device to a wall or other surface.

8. The system of claim 5 further comprising:
   a structural framework, wherein the first mounting device is provided at, connected to, or forms part of, the structural framework.

9. The system of claim 8 further comprising:
   a second side assembly comprising a second display layer, a second backlight, and a third mounting device located, at least in part, rearward of at least a viewing surface of the second display layer, said third mounting device comprising a third complementary portion extending, at least primarily, in the second vertical direction and the first horizontal direction to provide an opening in the second direction; and
   a fourth complementary portion provided at the first mounting device and extending, at least primarily, in the first vertical direction and the second horizontal direction to provide an opening in the first direction;
   wherein the first mounting device receives the second side assembly by complementary engagement of the fourth complementary portion and the third complementary portion such that the fourth complementary portion is received, at least in part, within the third complementary portion by way of the openings thereof, and the third complementary portion overlaps, at least in part, with the fourth complementary portion in a vertical and a horizontal direction, said complementary engagement securing, at least in part, the second side assembly to the first mounting device in a removable fashion.

10. The system of claim 9 wherein:

the fourth complementary portion is located at an opposing side of the first mounting device from the third complementary portion such that the side assembly and the second side assembly are removably secured to opposing sides of the structural framework.

11. The system of claim 1 further comprising:

a structural framework, wherein the first mounting device is provided at, connected to, or forms part of, the structural framework;

a second side assembly comprising a second display layer, a second backlight, and a third mounting device located, at least in part, rearward of at least a viewing surface of the second display layer, said third mounting device comprising a third complementary portion extending, at least primarily, in the second vertical direction and the first horizontal direction to provide an opening in the second direction; and a fourth complementary portion provided at the first mounting device and extending, at least primarily, in the first vertical direction and the second horizontal direction to provide an opening in the first direction;

wherein the first mounting device receives the second side assembly by complementary engagement of the fourth complementary portion and the third complementary portion such that the fourth complementary portion is received, at least in part, within the third complementary portion by way of the openings thereof, and the third complementary portion overlaps, at least in part, with the fourth complementary portion in a vertical and a horizontal direction, said complementary engagement securing, at least in part, the second side assembly to the first mounting device in a removable fashion.

12. The system of claim 1 wherein:

the side assembly comprises:

an open loop airflow pathway extending within the side assembly;

a closed loop airflow pathway extending within the side assembly;

a first set of one or more fans located along the open loop airflow pathway; and a second set of one or more fans located along the closed loop airflow pathway.

13. The system of claim 1 wherein:

the display layer comprises liquid crystals; and the backlight is arranged to directly backlight the display layer.

14. A method for mounting display assemblies using the system of claim 1, said system comprising:

raising the side assembly relative to, and independently from, the first mounting device such that said second complementary portion is positioned to clear the first complementary portion;

moving the side assembly laterally toward the first mounting device such that the second complementary portion at least partially overlaps the first complementary portion; and lowering the side assembly to engage the first complementary portion with the second complementary portion.

15. The system of claim 1 wherein:

the first vertical direction is downward;

the first horizontal direction is outward relative to a forward surface of the side assembly;

the second vertical direction is upward;

the second horizontal direction is inward relative to the forward surface of the side assembly;

the first direction is upward; and the second direction is downward.

16. A display assembly with integrated mounting system, said display assembly comprising:

a first mounting device comprising a first complementary portion extending, at least primarily, in an outward and upward direction to provide an upward facing opening; and a side assembly comprising a display layer, a backlight, and a second mounting device located, at least in part, rearward of at least a viewing surface of the display layer, said second mounting device comprising a second complementary portion extending, at least primarily, in an inward and downward direction to provide a downward facing opening, inward and outward being relative to a forward surface of the side assembly;

wherein the first mounting device receives the side assembly by complementary engagement of the first complementary portion and the second complementary portion by way of the upward and downward facing openings thereof such that the first complementary portion is received, at least in part, within and overlaps vertically and horizontally, at least in part with, the second complementary portion, said complementary engagement securing, at least in part, the side assembly to the first mounting device in a removable fashion.

17. The display assembly of claim 16 wherein:

the first complementary portion comprises a first set of one or more hook shaped portions;

the second complementary portion comprises a second set of one or more hook shaped portions;

said first mounting device comprising a first laterally extending portion from which the first set of one or more hook shaped portions of the first complementary portion extend; and said second mounting device comprising a second laterally extending portion from which the second set of one or more hook shaped portions of the second complementary portion extend.

18. The display assembly of claim 17 further comprising:

a structural framework comprising the first mounting device;

a second side assembly comprising a second display layer, a second backlight, and a third mounting device located, at least in part, rearward of at least a viewing surface of the second display layer, said third mounting device comprising a third complementary portion extending, at least primarily, in the inward and downward direction to provide a downward facing opening; and a fourth complementary portion provided at the first mounting device and extending, at least primarily, in the outward and upward direction to provide an upward facing opening;

wherein the first mounting device receives the second side assembly by complementary engagement of the fourth complementary portion and the third complementary portion, engagement of which secures the second side assembly to the first mounting device in a removable fashion.

19. The display assembly of claim 18 wherein:

the side assembly comprises a cover;

the display layer is located behind the cover;

the display layer comprises liquid crystals;

the backlight is positioned to direct backlight the display layer; and the first and second laterally extending portions have same or different lengths, each of which is within 80%-120% of a width of the cover.

20. A double sided display assembly with integrated mounting system, said display assembly comprising:

a structural framework comprising a first mounting device comprising a laterally extending portion, a first set of one or more hook shaped portions facing upward and extending from a first side of the laterally extending portion, and a second set of one or more hook shaped portions facing upward and extending from a second, opposing side of the laterally extending portion;

a first side assembly comprising a first cover, a first liquid crystal display layer located behind the first cover, a first backlight for directly backlighting the first liquid crystal display layer, and a second mounting device located rearward of the first liquid crystal display layer and comprising a third set of one or more hook shaped portions facing downward; and a second side assembly comprising a second cover, a second liquid crystal display layer located behind the second cover, a second backlight for directly backlighting the second liquid crystal display layer, and a third mounting device located rearward of the second liquid crystal display layer and comprising a fourth set of one or more hook shaped portions facing downward;

wherein the first mounting device receives the first side assembly by complementary engagement of the first set of one or more hook shaped portions with the third set of one or more hook shaped portions, engagement of which secures the first side assembly to the first mounting device in a removable fashion;

wherein the first mounting device receives the second side assembly by complementary engagement of the second set of one or more hook shaped portions with the fourth set of one or more hook shaped portions, engagement of which secures the second side assembly to the first mounting device in the removable fashion.

* * * * *